US011706899B2

(12) United States Patent
Lakhkar et al.

(10) Patent No.: US 11,706,899 B2
(45) Date of Patent: *Jul. 18, 2023

(54) ELECTRONICS ENCLOSURE WITH HEAT-TRANSFER ELEMENT

(71) Applicant: Emerson Climate Technologies, Inc., Sidney, OH (US)

(72) Inventors: Nikhil R. Lakhkar, Troy, OH (US); Kevin J. Gehret, Fort Loramie, OH (US); Russ M. Beisner, Versailles, OH (US)

(73) Assignee: Emerson Climate Technologies, Inc., Sidney, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/643,991

(22) Filed: Dec. 13, 2021

(65) Prior Publication Data

US 2022/0104391 A1 Mar. 31, 2022

Related U.S. Application Data

(63) Continuation of application No. 16/935,786, filed on Jul. 22, 2020, now Pat. No. 11,206,743.

(Continued)

(51) Int. Cl.
*H05K 7/20* (2006.01)
*F04B 39/06* (2006.01)

(52) U.S. Cl.
CPC ....... *H05K 7/20145* (2013.01); *F04B 39/066* (2013.01); *H05K 7/20154* (2013.01)

(58) Field of Classification Search
CPC ............ H05K 7/20145; H05K 7/20154; F04B 39/066; F04B 39/121
See application file for complete search history.

(56) References Cited

U.S. PATENT DOCUMENTS 2,883,255 A    4/1959  Anderson
2,981,076 A    4/1961  Gaugler et al.
(Continued)

FOREIGN PATENT DOCUMENTS

CA    2662482 A1    3/2008
CN    1051080 A     5/1991
(Continued)

OTHER PUBLICATIONS

International Search Report regarding International Application No. PCT/US2008/011441, dated Jan. 30, 2009.

(Continued)

*Primary Examiner* — Stephen S Sul
(74) *Attorney, Agent, or Firm* — Harness, Dickey & Pierce, P.L.C.

(57) ABSTRACT

A compressor may include a compressor shell, a motor, a compression mechanism, an enclosure, a control module, a fan, and an airflow deflector. The compression mechanism is disposed within the compressor shell. The motor drives the compression mechanism. The enclosure defines an internal cavity. The control module is in communication with the motor and is configured to control operation of the motor. The fan may be disposed within the internal cavity. The airflow deflector may include a base portion, a first leg, and a second leg. The first and second legs may be spaced apart from each other and may extend from the base portion. The fan may force air against the base portion. A first portion of the air may flow from the base portion along the first leg, and a second portion of the air may flow from the base portion along the second leg.

20 Claims, 9 Drawing Sheets

Related U.S. Application Data

(60) Provisional application No. 62/878,497, filed on Jul. 25, 2019.

(56) References Cited

U.S. PATENT DOCUMENTS

| | | |
|---|---|---|
| 3,082,609 A | 3/1963 | Ryan et al. |
| 3,242,321 A | 3/1966 | Chope |
| 3,265,948 A | 8/1966 | Sones et al. |
| 3,600,657 A | 8/1971 | Pfaff et al. |
| 3,723,823 A | 3/1973 | Lit et al. |
| 3,786,650 A | 1/1974 | Newton |
| 3,940,665 A | 2/1976 | Seki |
| 4,130,997 A | 12/1978 | Hara et al. |
| 4,131,331 A | 12/1978 | Kendall, Jr. |
| 4,280,910 A | 7/1981 | Baumann |
| 4,370,564 A | 1/1983 | Matsushita |
| 4,448,038 A | 5/1984 | Barbier |
| 4,459,519 A | 7/1984 | Erdman |
| 4,460,861 A | 7/1984 | Rosa |
| 4,461,153 A | 7/1984 | Lindner et al. |
| 4,507,936 A | 4/1985 | Yoshino |
| 4,527,399 A | 7/1985 | Lord |
| 4,546,405 A | 10/1985 | Hultmark et al. |
| 4,602,678 A | 7/1986 | Fick |
| 4,653,280 A | 3/1987 | Hansen et al. |
| 4,697,132 A | 9/1987 | Ronk et al. |
| 4,706,469 A | 11/1987 | Oguni et al. |
| 4,720,981 A | 1/1988 | Helt et al. |
| 4,750,338 A | 6/1988 | Hingst |
| 4,763,225 A | 8/1988 | Frenkel et al. |
| 4,830,580 A | 5/1989 | Hata et al. |
| 4,858,069 A | 8/1989 | Hughes |
| 4,899,256 A | 2/1990 | Sway-Tin |
| 4,940,929 A | 7/1990 | Williams |
| 4,974,427 A | 12/1990 | Diab |
| 5,056,712 A | 10/1991 | Enck |
| 5,058,389 A | 10/1991 | Yasuda et al. |
| 5,058,390 A | 10/1991 | Sindermann et al. |
| 5,182,918 A | 2/1993 | Manz et al. |
| 5,203,178 A | 4/1993 | Shyu |
| 5,220,809 A | 6/1993 | Voss |
| 5,255,529 A | 10/1993 | Powell et al. |
| 5,258,901 A | 11/1993 | Fraidlin |
| 5,269,146 A | 12/1993 | Kerner |
| 5,291,115 A | 3/1994 | Ehsani |
| 5,315,214 A | 5/1994 | Lesea |
| 5,347,467 A | 9/1994 | Staroselsky et al. |
| 5,359,276 A | 10/1994 | Mammano |
| 5,359,281 A | 10/1994 | Barrow et al. |
| 5,410,221 A | 4/1995 | Mattas et al. |
| 5,410,235 A | 4/1995 | Ehsani |
| 5,425,246 A | 6/1995 | Bessler |
| 5,426,952 A | 6/1995 | Bessler |
| 5,428,965 A | 7/1995 | Grunwald et al. |
| 5,440,218 A | 8/1995 | Oldenkamp |
| 5,482,109 A | 1/1996 | Kunkel |
| 5,502,970 A | 4/1996 | Rajendran |
| 5,506,930 A | 4/1996 | Umida |
| 5,519,300 A | 5/1996 | Leon et al. |
| 5,524,449 A | 6/1996 | Ueno et al. |
| 5,603,222 A | 2/1997 | Dube |
| 5,603,227 A | 2/1997 | Holden et al. |
| 5,646,499 A | 7/1997 | Doyama et al. |
| 5,663,627 A | 9/1997 | Ogawa |
| 5,712,551 A | 1/1998 | Lee |
| 5,712,802 A | 1/1998 | Kumar et al. |
| 5,729,995 A | 3/1998 | Tajima |
| 5,742,103 A | 4/1998 | Ashok |
| 5,786,992 A | 7/1998 | Vinciarelli et al. |
| 5,829,516 A | 11/1998 | Lavochkin |
| 5,898,572 A | 4/1999 | Shennib et al. |
| 5,903,138 A | 5/1999 | Hwang et al. |
| 5,960,207 A | 9/1999 | Brown |
| 5,963,442 A | 10/1999 | Yoshida et al. |
| 5,975,854 A | 11/1999 | Culp, III et al. |
| 6,005,365 A | 12/1999 | Kaneko et al. |
| 6,028,406 A | 2/2000 | Birk |
| 6,035,653 A | 3/2000 | Itoh et al. |
| 6,041,609 A | 3/2000 | Hornsleth et al. |
| 6,047,557 A | 4/2000 | Pham et al. |
| 6,065,298 A | 5/2000 | Fujimoto |
| 6,073,457 A | 6/2000 | Kampf et al. |
| 6,091,215 A | 7/2000 | Lovett et al. |
| 6,091,233 A | 7/2000 | Hwang et al. |
| 6,102,665 A | 8/2000 | Centers et al. |
| 6,116,040 A | 9/2000 | Stark |
| 6,123,146 A | 9/2000 | Dias |
| 6,185,944 B1 | 2/2001 | Gaul |
| 6,209,331 B1 | 4/2001 | Lake et al. |
| 6,220,045 B1 | 4/2001 | Kim |
| 6,222,746 B1 | 4/2001 | Kim |
| 6,226,998 B1 | 5/2001 | Reason et al. |
| 6,236,183 B1 | 5/2001 | Schroeder |
| 6,236,193 B1 | 5/2001 | Paul |
| 6,259,614 B1 | 7/2001 | Ribarich et al. |
| 6,281,656 B1 | 8/2001 | Masaki et al. |
| 6,281,658 B1 | 8/2001 | Han et al. |
| 6,302,654 B1 | 10/2001 | Millet et al. |
| 6,316,918 B1 | 11/2001 | Underwood et al. |
| 6,318,100 B1 | 11/2001 | Brendel et al. |
| 6,318,101 B1 | 11/2001 | Pham et al. |
| 6,321,549 B1 | 11/2001 | Reason et al. |
| 6,326,750 B1 | 12/2001 | Marcinkiewicz |
| 6,341,496 B1 | 1/2002 | Kettner et al. |
| 6,344,725 B2 | 2/2002 | Kaitani et al. |
| 6,370,888 B1 | 4/2002 | Grabon |
| 6,373,200 B1 | 4/2002 | Nerone et al. |
| 6,396,229 B1 | 5/2002 | Sakamoto et al. |
| 6,404,154 B2 | 6/2002 | Marcinkiewicz et al. |
| 6,406,265 B1 | 6/2002 | Hahn et al. |
| 6,414,462 B2 | 7/2002 | Chong |
| 6,434,960 B1 | 8/2002 | Rousseau |
| 6,438,978 B1 | 8/2002 | Bessler |
| 6,446,618 B1 | 9/2002 | Hill |
| 6,462,492 B1 | 10/2002 | Sakamoto et al. |
| 6,471,486 B1 | 10/2002 | Centers et al. |
| 6,477,053 B1 | 11/2002 | Zeidan et al. |
| 6,523,361 B2 | 2/2003 | Higashiyama |
| 6,532,754 B2 | 3/2003 | Haley et al. |
| 6,539,734 B1 | 4/2003 | Weyna |
| 6,542,359 B2 | 4/2003 | Babcock et al. |
| 6,578,373 B1 | 6/2003 | Barbier |
| 6,583,593 B2 | 6/2003 | Iijima et al. |
| 6,587,338 B2 | 7/2003 | LaCroix et al. |
| 6,604,372 B2 | 8/2003 | Baumert et al. |
| 6,615,594 B2 | 9/2003 | Jayanth et al. |
| 6,636,011 B2 | 10/2003 | Sadasivam et al. |
| 6,655,172 B2 | 12/2003 | Perevozchikov et al. |
| 6,661,664 B2 | 12/2003 | Sarno et al. |
| 6,670,784 B2 | 12/2003 | Odachi et al. |
| 6,688,124 B1 | 2/2004 | Stark et al. |
| 6,698,217 B2 | 3/2004 | Tanimoto et al. |
| 6,708,507 B1 | 3/2004 | Sem et al. |
| 6,708,521 B2 | 3/2004 | Wurth |
| 6,711,911 B1 | 3/2004 | Grabon et al. |
| 6,714,425 B2 | 3/2004 | Yamada et al. |
| 6,735,284 B2 | 5/2004 | Cheong et al. |
| 6,749,404 B2 | 6/2004 | Gennami et al. |
| 6,753,670 B2 | 6/2004 | Kadah |
| 6,756,753 B1 | 6/2004 | Marcinkiewicz |
| 6,756,757 B2 | 6/2004 | Marcinkiewicz et al. |
| 6,758,050 B2 | 7/2004 | Jayanth et al. |
| 6,767,851 B1 | 7/2004 | Rokman et al. |
| 6,785,145 B1 | 8/2004 | Wong |
| 6,788,024 B2 | 9/2004 | Kaneko et al. |
| 6,815,925 B2 | 11/2004 | Chen et al. |
| 6,825,637 B2 | 11/2004 | Kinpara et al. |
| 6,828,751 B2 | 12/2004 | Sadasivam et al. |
| 6,831,439 B2 | 12/2004 | Won et al. |
| 6,833,990 B2 | 12/2004 | LaCroix et al. |
| 6,857,845 B2 | 2/2005 | Stabley et al. |
| 6,876,171 B2 | 4/2005 | Lee |
| 6,898,072 B2 | 5/2005 | Beihoff et al. |
| 6,915,646 B2 | 7/2005 | Kadle et al. |

(56) References Cited

U.S. PATENT DOCUMENTS

| | | |
|---|---|---|
| 6,955,039 B2 | 10/2005 | Nomura et al. |
| 6,966,759 B2 | 11/2005 | Hahn et al. |
| 6,967,851 B2 | 11/2005 | Yang et al. |
| 6,982,533 B2 | 1/2006 | Seibel et al. |
| 6,984,948 B2 | 1/2006 | Nakata et al. |
| 7,005,829 B2 | 2/2006 | Schnetzka |
| RE39,060 E | 4/2006 | Okui et al. |
| 7,049,774 B2 | 5/2006 | Chin et al. |
| 7,095,208 B2 | 8/2006 | Kawaji et al. |
| 7,096,681 B2 | 8/2006 | Wills et al. |
| 7,130,196 B2 | 10/2006 | Thomas et al. |
| 7,138,777 B2 | 11/2006 | Won et al. |
| 7,143,594 B2 | 12/2006 | Ludwig et al. |
| 7,154,237 B2 | 12/2006 | Welchko et al. |
| 7,176,644 B2 | 2/2007 | Ueda et al. |
| 7,180,273 B2 | 2/2007 | Bocchiola et al. |
| 7,184,902 B2 | 2/2007 | El-Ibiary |
| 7,208,895 B2 | 4/2007 | Marcinkiewicz et al. |
| 7,234,305 B2 | 6/2007 | Nomura et al. |
| 7,251,133 B2 | 7/2007 | Wallace |
| 7,272,018 B2 | 9/2007 | Yamada et al. |
| 7,295,436 B2 | 11/2007 | Cheon |
| 7,307,401 B2 | 12/2007 | Gataric et al. |
| 7,342,379 B2 | 3/2008 | Marcinkiewicz et al. |
| 7,375,485 B2 | 5/2008 | Shahi et al. |
| 7,391,610 B2 | 6/2008 | Schultz et al. |
| 7,458,223 B2 | 12/2008 | Pham |
| 7,495,410 B2 | 2/2009 | Zargari et al. |
| 7,525,798 B2 | 4/2009 | Schultz et al. |
| 7,554,271 B2 | 6/2009 | Thiery et al. |
| 7,580,272 B2 | 8/2009 | Taguchi et al. |
| 7,595,613 B2 | 9/2009 | Thompson et al. |
| 7,605,570 B2 | 10/2009 | Liu et al. |
| 7,613,018 B2 | 11/2009 | Lim et al. |
| 7,628,028 B2 | 12/2009 | Tolbert, Jr. et al. |
| 7,639,500 B2 | 12/2009 | Lang et al. |
| 7,644,591 B2 | 1/2010 | Singh et al. |
| 7,660,139 B2 | 2/2010 | Garabandic |
| 7,667,986 B2 | 2/2010 | Artusi et al. |
| 7,673,389 B2 | 3/2010 | Lehman et al. |
| 7,675,759 B2 | 3/2010 | Artusi et al. |
| 7,683,568 B2 | 3/2010 | Pande et al. |
| 7,688,608 B2 | 3/2010 | Oettinger et al. |
| 7,706,143 B2 | 4/2010 | Lang et al. |
| 7,723,964 B2 | 5/2010 | Taguchi |
| 7,733,678 B1 | 6/2010 | Notohamiprodjo et al. |
| 7,738,228 B2 | 6/2010 | Taylor |
| 7,782,033 B2 | 8/2010 | Turchi et al. |
| 7,821,237 B2 | 10/2010 | Melanson |
| 7,895,003 B2 | 2/2011 | Caillat |
| 7,905,702 B2 | 3/2011 | Stabley et al. |
| 8,418,483 B2 | 4/2013 | McSweeney et al. |
| 8,448,459 B2 | 5/2013 | McSweeney et al. |
| 8,459,053 B2 | 6/2013 | Pham et al. |
| 8,539,786 B2 | 9/2013 | McSweeney |
| 8,849,613 B2 | 9/2014 | Caillat |
| 8,950,201 B2 | 2/2015 | Voorhis |
| 8,950,206 B2 | 2/2015 | Caillat |
| 9,021,823 B2 | 5/2015 | Caillat |
| 9,057,549 B2 | 6/2015 | McSweeney |
| 9,241,427 B1 | 1/2016 | Stevens et al. |
| 9,476,625 B2 | 10/2016 | McSweeney |
| 9,494,158 B2 | 11/2016 | Pham et al. |
| 9,494,354 B2 | 11/2016 | McSweeney et al. |
| 9,541,907 B2 | 1/2017 | McSweeney |
| 9,683,563 B2 | 6/2017 | Caillat |
| 9,740,250 B2 | 8/2017 | Honda et al. |
| 9,784,274 B2 | 10/2017 | Brostrom et al. |
| 10,077,774 B2 | 9/2018 | Seibel et al. |
| 10,125,768 B2 * | 11/2018 | Brostrom ............... F04C 18/16 |
| 11,206,743 B2 * | 12/2021 | Lakhkar ............... F04B 39/121 |
| 2001/0022939 A1 | 9/2001 | Morita et al. |
| 2002/0047635 A1 | 4/2002 | Ribarich et al. |
| 2002/0062656 A1 | 5/2002 | Suitou et al. |
| 2002/0108384 A1 | 8/2002 | Higashiyama |
| 2002/0117989 A1 | 8/2002 | Kawabata et al. |
| 2002/0157408 A1 | 10/2002 | Egawa et al. |
| 2002/0162339 A1 | 11/2002 | Harrison et al. |
| 2003/0019221 A1 | 1/2003 | Rossi et al. |
| 2003/0077179 A1 | 4/2003 | Collins et al. |
| 2003/0085621 A1 | 5/2003 | Potega |
| 2003/0094004 A1 | 5/2003 | Pham et al. |
| 2003/0146290 A1 | 8/2003 | Wang et al. |
| 2003/0182956 A1 | 10/2003 | Kurita et al. |
| 2004/0011020 A1 | 1/2004 | Nomura et al. |
| 2004/0061472 A1 | 4/2004 | Won et al. |
| 2004/0070364 A1 | 4/2004 | Cheong et al. |
| 2004/0085785 A1 | 5/2004 | Taimela |
| 2004/0100221 A1 | 5/2004 | Fu |
| 2004/0107716 A1 | 6/2004 | Hirota |
| 2004/0119434 A1 | 6/2004 | Dadd |
| 2004/0183491 A1 | 9/2004 | Sidey |
| 2004/0221594 A1 | 11/2004 | Suzuki et al. |
| 2004/0261431 A1 | 12/2004 | Singh et al. |
| 2004/0261448 A1 | 12/2004 | Nishijima et al. |
| 2005/0047179 A1 | 3/2005 | Lesea |
| 2005/0052843 A1 | 3/2005 | Baker et al. |
| 2005/0115257 A1 | 6/2005 | Goth et al. |
| 2005/0204760 A1 | 9/2005 | Kurita et al. |
| 2005/0210900 A1 | 9/2005 | Oomura et al. |
| 2005/0235660 A1 | 10/2005 | Pham |
| 2005/0235661 A1 | 10/2005 | Pham |
| 2005/0235662 A1 | 10/2005 | Pham |
| 2005/0235663 A1 | 10/2005 | Pham |
| 2005/0235664 A1 | 10/2005 | Pham |
| 2005/0247073 A1 | 11/2005 | Hikawa et al. |
| 2005/0262849 A1 | 12/2005 | Nomura et al. |
| 2005/0268631 A1 | 12/2005 | Matsunaga et al. |
| 2005/0270814 A1 | 12/2005 | Oh |
| 2006/0041335 A9 | 2/2006 | Rossi et al. |
| 2006/0042276 A1 | 3/2006 | Doll et al. |
| 2006/0048530 A1 | 3/2006 | Jun et al. |
| 2006/0056210 A1 | 3/2006 | Yamada et al. |
| 2006/0090490 A1 | 5/2006 | Grimm et al. |
| 2006/0117773 A1 | 6/2006 | Street et al. |
| 2006/0123809 A1 | 6/2006 | Ha et al. |
| 2006/0130501 A1 | 6/2006 | Singh et al. |
| 2006/0130504 A1 | 6/2006 | Agrawal et al. |
| 2006/0150651 A1 | 7/2006 | Goto et al. |
| 2006/0158073 A1 | 7/2006 | Maeda |
| 2006/0158912 A1 | 7/2006 | Wu et al. |
| 2006/0185373 A1 | 8/2006 | Butler et al. |
| 2006/0187693 A1 | 8/2006 | Tang |
| 2006/0198172 A1 | 9/2006 | Wood |
| 2006/0198744 A1 | 9/2006 | Lifson et al. |
| 2006/0247895 A1 | 11/2006 | Jayanth |
| 2006/0255772 A1 | 11/2006 | Chen |
| 2006/0261830 A1 | 11/2006 | Taylor |
| 2006/0290302 A1 | 12/2006 | Marcinkiewicz et al. |
| 2007/0012052 A1 | 1/2007 | Butler et al. |
| 2007/0029987 A1 | 2/2007 | Li |
| 2007/0040524 A1 | 2/2007 | Sarlioglu et al. |
| 2007/0040534 A1 | 2/2007 | Ghosh et al. |
| 2007/0089424 A1 | 4/2007 | Venkataraman et al. |
| 2007/0118307 A1 | 5/2007 | El-Ibiary |
| 2007/0118308 A1 | 5/2007 | El-Ibiary |
| 2007/0132437 A1 | 6/2007 | Scollo et al. |
| 2007/0144354 A1 | 6/2007 | Muller et al. |
| 2007/0186581 A1 | 8/2007 | Mistry et al. |
| 2007/0289322 A1 | 12/2007 | Mathews |
| 2008/0060791 A1 | 3/2008 | Strobel et al. |
| 2008/0089792 A1 | 4/2008 | Bae et al. |
| 2008/0110610 A1 | 5/2008 | Lifson et al. |
| 2008/0112823 A1 | 5/2008 | Yoshida et al. |
| 2008/0143289 A1 | 6/2008 | Marcinkiewicz et al. |
| 2008/0160840 A1 | 7/2008 | Bax et al. |
| 2008/0180055 A1 | 7/2008 | Zargari et al. |
| 2008/0209925 A1 | 9/2008 | Pham |
| 2008/0216494 A1* | 9/2008 | Pham ................ F04C 18/0215 62/190 |
| 2008/0232065 A1 | 9/2008 | Lang et al. |
| 2008/0245083 A1 | 10/2008 | Tutunoglu et al. |
| 2008/0252269 A1 | 10/2008 | Feldtkeller et al. |
| 2008/0265847 A1 | 10/2008 | Woo et al. |

(56) References Cited

U.S. PATENT DOCUMENTS

| | | |
|---|---|---|
| 2008/0272745 A1 | 11/2008 | Melanson |
| 2008/0272747 A1 | 11/2008 | Melanson |
| 2008/0273356 A1 | 11/2008 | Melanson |
| 2008/0284399 A1 | 11/2008 | Oettinger et al. |
| 2008/0285318 A1 | 11/2008 | Tan et al. |
| 2009/0015214 A1 | 1/2009 | Chen |
| 2009/0015225 A1 | 1/2009 | Turchi et al. |
| 2009/0016087 A1 | 1/2009 | Shimizu |
| 2009/0027851 A1 | 1/2009 | Doczy et al. |
| 2009/0033296 A1 | 2/2009 | Hammerstrom |
| 2009/0039852 A1 | 2/2009 | Fishelov et al. |
| 2009/0059625 A1 | 3/2009 | Viitanen et al. |
| 2009/0071175 A1* | 3/2009 | Pham .................. F25B 49/02 62/149 |
| 2009/0085510 A1 | 4/2009 | Pande et al. |
| 2009/0090113 A1 | 4/2009 | Caillat |
| 2009/0090117 A1 | 4/2009 | McSweeney |
| 2009/0090118 A1 | 4/2009 | Pham et al. |
| 2009/0091961 A1 | 4/2009 | Hsia et al. |
| 2009/0092501 A1 | 4/2009 | Seibel |
| 2009/0092502 A1 | 4/2009 | Marcinkiewicz |
| 2009/0093911 A1 | 4/2009 | Caillat |
| 2009/0094997 A1 | 4/2009 | McSweeney |
| 2009/0094998 A1 | 4/2009 | McSweeney et al. |
| 2009/0095002 A1 | 4/2009 | McSweeney et al. |
| 2009/0112368 A1 | 4/2009 | Mann, III et al. |
| 2009/0140680 A1 | 6/2009 | Park |
| 2009/0194177 A1 | 8/2009 | Yokota et al. |
| 2009/0237963 A1 | 9/2009 | Prasad et al. |
| 2009/0241592 A1 | 10/2009 | Stover |
| 2009/0243561 A1 | 10/2009 | Tan et al. |
| 2009/0255278 A1 | 10/2009 | Taras et al. |
| 2009/0273330 A1 | 11/2009 | Sisson |
| 2009/0290395 A1 | 11/2009 | Osaka |
| 2009/0295347 A1 | 12/2009 | Popescu et al. |
| 2009/0303765 A1 | 12/2009 | Shimizu et al. |
| 2009/0314018 A1 | 12/2009 | Burchill et al. |
| 2009/0316454 A1 | 12/2009 | Colbeck et al. |
| 2010/0007317 A1 | 1/2010 | Yang |
| 2010/0014326 A1 | 1/2010 | Gu et al. |
| 2010/0014329 A1 | 1/2010 | Zhang et al. |
| 2010/0052601 A1 | 3/2010 | Pummer |
| 2010/0052641 A1 | 3/2010 | Popescu et al. |
| 2010/0057263 A1 | 3/2010 | Tutunoglu |
| 2010/0079125 A1 | 4/2010 | Melanson et al. |
| 2010/0080026 A1 | 4/2010 | Zhang |
| 2010/0109615 A1 | 5/2010 | Hwang et al. |
| 2010/0109626 A1 | 5/2010 | Chen |
| 2010/0118571 A1 | 5/2010 | Saint-Pierre |
| 2010/0118576 A1 | 5/2010 | Osaka |
| 2010/0128503 A1 | 5/2010 | Liu et al. |
| 2010/0156377 A1 | 6/2010 | Siegler |
| 2010/0165683 A1 | 7/2010 | Sugawara |
| 2010/0179703 A1 | 7/2010 | Singh et al. |
| 2010/0181930 A1 | 7/2010 | Hopwood et al. |
| 2010/0187914 A1 | 7/2010 | Rada et al. |
| 2010/0202169 A1 | 8/2010 | Gaboury et al. |
| 2010/0226149 A1 | 9/2010 | Masumoto |
| 2010/0246220 A1 | 9/2010 | Irving et al. |
| 2010/0246226 A1 | 9/2010 | Ku et al. |
| 2010/0253307 A1 | 10/2010 | Chen et al. |
| 2010/0259230 A1 | 10/2010 | Boothroyd |
| 2010/0270984 A1 | 10/2010 | Park et al. |
| 2011/0138826 A1 | 6/2011 | Lifson et al. |
| 2012/0279251 A1 | 11/2012 | Kido et al. |
| 2013/0255932 A1 | 10/2013 | Doepker et al. |
| 2014/0033746 A1 | 2/2014 | McSweeney |
| 2015/0051742 A1 | 2/2015 | Caillat |
| 2015/0285255 A1 | 10/2015 | Tsujimoto et al. |
| 2015/0337825 A1 | 11/2015 | Chou |
| 2016/0091264 A1 | 3/2016 | Lu et al. |
| 2016/0319816 A1 | 11/2016 | Brostrom et al. |
| 2017/0130975 A1 | 5/2017 | Shoemaker et al. |
| 2017/0241442 A1 | 8/2017 | Groshek |
| 2017/0311486 A1 | 10/2017 | Milligan et al. |
| 2019/0017508 A1 | 1/2019 | Pham et al. |

FOREIGN PATENT DOCUMENTS

| | | |
|---|---|---|
| CN | 1284609 A | 2/2001 |
| CN | 1382912 A | 12/2002 |
| CN | 1532474 A | 9/2004 |
| CN | 1654893 A | 8/2005 |
| CN | 1671964 A | 9/2005 |
| CN | 1677016 A | 10/2005 |
| CN | 1697954 A | 11/2005 |
| CN | 1804489 A | 7/2006 |
| CN | 1806478 A | 7/2006 |
| CN | 1830131 A | 9/2006 |
| CN | 1987258 A | 6/2007 |
| CN | 100339664 C | 9/2007 |
| CN | 101354158 A | 1/2009 |
| CN | 201348396 Y | 11/2009 |
| CN | 101821509 A | 9/2010 |
| CN | 202068704 U | 12/2011 |
| CN | 202076934 U | 12/2011 |
| CN | 202083049 U | 12/2011 |
| CN | 203258933 U | 10/2013 |
| DE | 19859340 A1 | 7/2000 |
| DE | 10036378 A1 | 5/2001 |
| DE | 10328213 A1 | 1/2005 |
| DE | 102006036282 A1 | 2/2007 |
| EP | 0697086 B1 | 5/1999 |
| EP | 0697087 B1 | 8/1999 |
| EP | 0933603 A1 | 8/1999 |
| EP | 1037001 A2 | 9/2000 |
| EP | 1146299 A1 | 10/2001 |
| EP | 1209362 A2 | 5/2002 |
| EP | 1541869 A1 | 6/2005 |
| EP | 1580498 A2 | 9/2005 |
| JP | S55155134 A | 12/1980 |
| JP | S61145887 U | 9/1986 |
| JP | S61272483 A | 12/1986 |
| JP | S6277539 A | 4/1987 |
| JP | H01167556 A | 7/1989 |
| JP | H02004163 A | 1/1990 |
| JP | H03129255 A | 6/1991 |
| JP | H04344073 A | 11/1992 |
| JP | H05322224 A | 12/1993 |
| JP | H06159738 A | 6/1994 |
| JP | H07035393 A | 2/1995 |
| JP | H0926246 A | 1/1997 |
| JP | H09196524 A | 7/1997 |
| JP | H10009546 A | 1/1998 |
| JP | H10097331 A | 4/1998 |
| JP | H10153353 A | 6/1998 |
| JP | H10160271 A | 6/1998 |
| JP | H1123075 A | 1/1999 |
| JP | H11159895 A | 6/1999 |
| JP | H11287497 A | 10/1999 |
| JP | 2000002496 A | 1/2000 |
| JP | 2000205630 A | 7/2000 |
| JP | 2000227092 A | 8/2000 |
| JP | 2000297970 A | 10/2000 |
| JP | 2001026214 A | 1/2001 |
| JP | 2001317470 A | 11/2001 |
| JP | 2002013858 A | 1/2002 |
| JP | 2002243246 A | 8/2002 |
| JP | 2002372322 A | 12/2002 |
| JP | 2003074945 A | 3/2003 |
| JP | 2003156244 A | 5/2003 |
| JP | 2004069295 A | 3/2004 |
| JP | 2004135491 A | 4/2004 |
| JP | 2005003710 A | 1/2005 |
| JP | 2005132167 A | 5/2005 |
| JP | 2005282972 A | 10/2005 |
| JP | 2006170537 A | 6/2006 |
| JP | 3799732 B2 | 7/2006 |
| JP | 2006177214 A | 7/2006 |
| JP | 2006188954 A | 7/2006 |
| JP | 2006233820 A | 9/2006 |
| JP | 2007198230 A | 8/2007 |

(56) References Cited

FOREIGN PATENT DOCUMENTS

| | | | |
|---|---|---|---|
| JP | 2007198705 | A | 8/2007 |
| JP | 4150870 | B2 | 9/2008 |
| JP | 2009264699 | A | 11/2009 |
| JP | 2010266132 | A | 11/2010 |
| JP | 2011033340 | A | 2/2011 |
| KR | 960024115 | A | 7/1996 |
| KR | 20010044273 | A | 6/2001 |
| KR | 20010114098 | A | 12/2001 |
| KR | 20030011415 | A | 2/2003 |
| KR | 20050059842 | A | 6/2005 |
| KR | 20050085544 | A | 8/2005 |
| KR | 20070071407 | A | 7/2007 |
| KR | 20090050316 | A | 5/2009 |
| KR | 20090052668 | A | 5/2009 |
| WO | WO-9523943 | A1 | 9/1995 |
| WO | WO-9523944 | A1 | 9/1995 |
| WO | WO-9702729 | A1 | 1/1997 |
| WO | WO-9911987 | A1 | 3/1999 |
| WO | WO-9913225 | A1 | 3/1999 |
| WO | WO-02090840 | A2 | 11/2002 |
| WO | WO-02090842 | A2 | 11/2002 |
| WO | WO-02090913 | A1 | 11/2002 |
| WO | WO-03038987 | A1 | 5/2003 |
| WO | WO-2004059822 | A1 | 7/2004 |
| WO | WO-2004083744 | A1 | 9/2004 |
| WO | WO-2005101939 | A1 | 10/2005 |
| WO | WO-2006023075 | A2 | 3/2006 |
| WO | WO-2006057529 | A2 | 6/2006 |
| WO | WO-2009045495 | A1 | 4/2009 |
| WO | WO-2009048466 | A1 | 4/2009 |
| WO | WO-2009048566 | A2 | 4/2009 |
| WO | WO-2009048575 | A1 | 4/2009 |
| WO | WO-2009048576 | A1 | 4/2009 |
| WO | WO-2009048577 | A2 | 4/2009 |
| WO | WO-2009048578 | A1 | 4/2009 |
| WO | WO-2009048579 | A2 | 4/2009 |
| WO | WO-2009151841 | A1 | 12/2009 |
| WO | WO-2011083756 | A1 | 7/2011 |
| WO | WO-2012028144 | A2 | 3/2012 |
| WO | 2014068651 | A1 | 5/2014 |

OTHER PUBLICATIONS

Written Opinion of the International Searching Authority regarding International Application No. PCT/US2008/011441, dated Jan. 30, 2009.
International Search Report regarding International Application No. PCT/US2008/011442, dated Feb. 3, 2009.
Written Opinion of the International Searching Authority regarding International Application No. PCT/US2008/011442, dated Feb. 3, 2009.
International Search Report regarding International Application No. PCT/US2008/011596, dated Feb. 25, 2009.
Written Opinion of the International Searching Authority regarding International Application No. PCT/US2008/011596, dated Feb. 25, 2009.
International Search Report regarding International Application No. PCT/US2008/011589, dated Feb. 27, 2009.
Written Opinion of the International Searching Authority regarding International Application No. PCT/US2008/011589, dated Feb. 27, 2009.
International Search Report regarding International Application No. PCT/US2008/011590, dated Feb. 27, 2009.
Written Opinion of the International Searching Authority regarding International Application No. PCT/US2008/011590, dated Feb. 27, 2009.
International Search Report regarding International Application No. PCT/US2008/011464, dated Mar. 13, 2009.
Written Opinion of the International Searching Authority regarding International Application No. PCT/US2008/011464, dated Mar. 13, 2009.
International Search Report regarding International Application No. PCT/US2008/011576, dated Mar. 23, 2009.
Written Opinion of the International Searching Authority regarding International Application No. PCT/US2008/011576, dated Mar. 23, 2009.
International Search Report regarding International Application No. PCT/US2008/011570, dated May 26, 2009.
Written Opinion of the International Searching Authority regarding International Application No. PCT/US2008/011570, dated May 26, 2009.
International Search Report regarding International Application No. PCT/US2008/011593, dated Jun. 17, 2009.
Written Opinion of the International Searching Authority regarding International Application No. PCT/US2008/011593, dated Jun. 17, 2009.
International Search Report regarding International Application No. PCT/US2008/011597, dated Jun. 19, 2009.
Written Opinion of the International Searching Authority regarding International Application No. PCT/US2008/011597, dated Jun. 19, 2009.
Suvo, "Electrical Power vs Mechanical Power." Bright Hub Inc., http://www.brighthubengineering.com/machine-design/62310-electrical-power-vs-mechanical-power/, 2 pages (Jan. 25, 2010).
International Preliminary Report on Patentability regarding International Application No. PCT/US2008/011441, dated Apr. 7, 2010.
International Preliminary Report on Patentability regarding International Application No. PCT/US2008/011442, dated Apr. 7, 2010.
International Preliminary Report on Patentability regarding International Application No. PCT/US2008/011464, dated Apr. 7, 2010.
International Preliminary Report on Patentability regarding International Application No. PCT/US2008/011570, dated Apr. 13, 2010.
International Preliminary Report on Patentability regarding International Application No. PCT/US2008/011576, dated Apr. 13, 2010.
International Preliminary Report on Patentability regarding International Application No. PCT/US2008/011589, dated Apr. 13, 2010.
International Preliminary Report on Patentability regarding International Application No. PCT/US2008/011590, dated Apr. 13, 2010.
International Preliminary Report on Patentability regarding International Application No. PCT/US2008/011593, dated Apr. 13, 2010.
International Preliminary Report on Patentability regarding International Application No. PCT/US2008/011596, dated Apr. 13, 2010.
International Preliminary Report on Patentability regarding International Application No. PCT/US2008/011597, dated Apr. 13, 2010.
Notice of Allowance regarding U.S. Appl. No. 12/244,528, dated Sep. 7, 2010.
Supplemental Notice of Allowability regarding U.S. Appl. No. 12/244,528, dated Dec. 17, 2010.
Office Action regarding U.S. Appl. No. 12/246,825, dated Jan. 4, 2011.
Supplemental Notice of Allowability regarding U.S. Appl. No. 12/244,528, dated Jan. 12, 2011.
Office Action regarding U.S. Appl. No. 12/247,033, dated Jan. 21, 2011.
Office Action regarding Chinese Patent Application No. 200880110551.6, dated Feb. 11, 2011. Translation provided by Unitalen Attorneys At Law.
Office Action regarding Australian Patent Application No. 2008311363, dated Feb. 15, 2011.
Office Action regarding U.S. Appl. No. 12/247,001, dated Feb. 25, 2011.
Office Action regarding U.S. Appl. No. 12/244,387, dated Mar. 3, 2011.
Interview Summary regarding U.S. Appl. No. 12/247,001, dated Mar. 25, 2011.
Interview Summary regarding U.S. Appl. No. 12/247,033, dated Mar. 25, 2011.
Office Action regarding U.S. Appl. No. 12/246,893, dated Apr. 1, 2011.
Office Action regarding Chinese Patent Application No. 200880110665.0, dated Apr. 8, 2011. Translation provided by Unitalen Attorneys At Law.

(56) References Cited

OTHER PUBLICATIONS

Office Action regarding Korean Patent Application No. 10-2010-7009374, dated May 31, 2011. Translation provided by Y.S. Chang & Associates.
Office Action regarding U.S. Appl. No. 12/246,825, dated Jun. 14, 2011.
Interview Summary regarding U.S. Appl. No. 12/246,893, dated Jun. 15, 2011.
Office Action regarding U.S. Appl. No. 12/246,959, dated Jun. 21, 2011.
Office Action regarding U.S. Appl. No. 12/247,033, dated Jul. 12, 2011.
Office Action regarding U.S. Appl. No. 12/246,893, dated Aug. 1, 2011.
Office Action regarding U.S. Appl. No. 12/244,416, dated Aug. 8, 2011.
Office Action regarding U.S. Appl. No. 12/244,387, dated Aug. 17, 2011.
Advisory Action regarding U.S. Appl. No. 12/246,825, dated Aug. 23, 2011.
Office Action regarding U.S. Appl. No. 12/247,001, dated Sep. 1, 2011.
Office Action regarding U.S. Appl. No. 12/247,020, dated Sep. 1, 2011.
Interview Summary regarding U.S. Appl. No. 12/246,825, dated Sep. 6, 2011.
Office Action regarding U.S. Appl. No. 12/246,927, dated Sep. 6, 2011.
Interview Summary regarding U.S. Appl. No. 12/244,387, dated Sep. 9, 2011.
Office Action regarding U.S. Appl. No. 12/246,825, dated Oct. 12, 2011.
Office Action regarding U.S. Appl. No. 12/246,959, dated Oct. 12, 2011.
Interview Summary regarding U.S. Appl. No. 12/246,893, dated Oct. 25, 2011.
Office Action regarding Korean Patent Application No. 10-2010-7007581, dated Nov. 14, 2011. Translation provided by Y.S. Chang & Associates.
Office Action regarding U.S. Appl. No. 12/244,416, dated Nov. 15, 2011.
Interview Summary regarding U.S. Appl. No. 12/246,927, dated Nov. 16, 2011.
Office Action regarding Korean Patent Application No. 10-2010-7009374, dated Nov. 18, 2011. Translation provided by Y.S. Chang & Associates.
Office Action regarding Chinese Patent Application No. 200880111091.9, dated Nov. 23, 2011. Translation provided by Unitalen Attorneys at Law.
Interview Summary regarding U.S. Appl. No. 12/247,020, dated Dec. 1, 2011.
Interview Summary regarding U.S. Appl. No. 12/246,927, dated Dec. 2, 2011.
Office Action regarding Korean Patent Application No. 10-2010-7007375, dated Dec. 7, 2011. Translation provided by Y.S. Chang & Associates.
Office Action regarding U.S. Appl. No. 12/246,893, dated Dec. 7, 2011.
Office Action regarding Chinese Patent Application No. 200880110266.4, dated Dec. 23, 2011. Translation provided by Unitalen Attorneys at Law.
Office Action regarding Chinese Patent Application No. 200880110484.8, dated Dec. 23, 2011. Translation provided by Unitalen Attorneys at Law.
Office Action regarding Korean Patent Application No. 10-2010-7007583, dated Dec. 28, 2011. Translation provided by Y.S. Chang & Associates.
Office Action regarding Chinese Patent Application No. 200880110276.8, dated Jan. 5, 2012. Translation provided by Unitalen Attorneys at Law.

Office Action regarding U.S. Appl. No. 12/247,033, dated Jan. 19, 2012.
Office Action regarding Korean Patent Application No. 10-2010-7009659, dated Feb. 8, 2012. Translation provided by Y.S. Chang & Associates.
Office Action regarding Chinese Patent Application No. 200880110590.6, dated Feb. 29, 2012. Translation provided by Unitalen Attorneys at Law.
Office Action regarding U.S. Appl. No. 12/244,387, dated Mar. 1, 2012.
Examiner's Answer to Appeal Brief regarding U.S. Appl. No. 12/247,001, dated Mar. 26, 2012.
Office Action regarding Korean Patent Application No. 10-2010-7007375, dated Apr. 3, 2012. Translation provided by Y.S. Chang & Associates.
Office Action regarding Chinese Patent Application No. 200880110665.0, dated Apr. 5, 2012. Translation provided by Unitalen Attorneys at Law.
Office Action regarding U.S. Appl. No. 12/246,893, dated Apr. 25, 2012.
Office Action regarding Chinese Patent Application No. 200880110785.0, dated May 14, 2012. Translation provided by Unitalen Attorneys at Law.
Office Action regarding Korean Patent Application No. 10-2010-7006707, dated May 22, 2012. Translation provided by Y.S. Chang & Associates.
Office Action regarding Chinese Patent Application No. 200880111072.6, dated Jun. 5, 2012. Translation provided by Unitalen Attorneys at Law.
Office Action regarding U.S. Appl. No. 12/246,927, dated Jun. 6, 2012.
Office Action regarding U.S. Appl. No. 12/247,020, dated Jun. 6, 2012.
Office Action regarding Korean Patent Application No. 10-2010-7007052, dated Jun. 12, 2012. Translation provided by Y.S. Chang & Associates.
Office Action regarding U.S. Appl. No. 12/246,959, dated Jun. 13, 2012.
Office Action regarding Chinese Patent Application No. 200880110616.7, dated Jul. 4, 2012. Translation provided by Unitalen Attorneys at Law.
Office Action regarding U.S. Appl. No. 12/247,033, dated Jul. 5, 2012.
Office Action regarding Chinese Patent Application No. 200880110276.8, dated Jul. 23, 2012. Translation provided by Unitalen Attorneys at Law.
Office Action regarding Chinese Patent Application No. 200880111091.9, dated Jul. 30, 2012. Translation provided by Unitalen Attorneys at Law.
Office Action regarding U.S. Appl. No. 12/244,387, dated Aug. 13, 2012.
Office Action regarding Chinese Patent Application No. 200880110484.8, dated Aug. 17, 2012. Translation provided by Unitalen Attorneys at Law.
Office Action regarding Chinese Patent Application No. 200880110266.4, dated Aug. 22, 2012. Translation provided by Unitalen Attorneys at Law.
Center for Support of Teaching and Learning, "Solving System of Equations by Substitution." Self-Instructional Mathematics Tutorials, Syracuse University, http://cstl.syr.edu/fipse/algebra/unit5/subst.htm, 4 pages (Aug. 30, 2012).
Interview Summary regarding U.S. Appl. No. 12/246,927, dated Sep. 5, 2012.
Interview Summary regarding U.S. Appl. No. 12/247,020, dated Sep. 6, 2012.
Office Action regarding Korean Patent Application No. 10-2010-7006707, dated Oct. 23, 2012. Translation provided by Y.S. Chang & Associates.
Office Action regarding Korean Patent Application No. 10-2010-7007052, dated Oct. 23, 2012. Translation provided by Y.S. Chang & Associates.
Advisory Action regarding U.S. Appl. No. 12/244,387, dated Nov. 1, 2012.

(56) References Cited

OTHER PUBLICATIONS

Office Action regarding Chinese Patent Application No. 200880110665.0, dated Nov. 16, 2012. Translation provided by Unitalen Attorneys at Law.
Examiner's Answer to Appeal Brief regarding U.S. Appl. No. 12/246,893, dated Nov. 26, 2012.
Office Action regarding U.S. Appl. No. 12/246,959, dated Dec. 4, 2012.
Office Action regarding Chinese Patent Application No. 200880110590.6, dated Dec. 5, 2012. Translation provided by Unitalen Attorneys at Law.
Interview Summary regarding U.S. Appl. No. 12/247,020, dated Dec. 11, 2012.
Notice of Allowance regarding U.S. Appl. No. 12/246,927, dated Dec. 21, 2012.
Office Action regarding Chinese Patent Application No. 200880110785.0, dated Dec. 28, 2012. Translation provided by Unitalen Attorneys at Law.
Notice of Allowance regarding U.S. Appl. No. 12/247,020, dated Jan. 4, 2013.
Office Action regarding U.S. Appl. No. 12/247,033, dated Jan. 29, 2013.
Notice of Allowance regarding U.S. Appl. No. 12/246,959, dated Feb. 14, 2013.
Office Action regarding Chinese Patent Application No. 200880111091.9, dated Feb. 18, 2013. Translation provided by Unitalen Attorneys at Law.
Office Action regarding Chinese Patent Application No. 200880110266.4, dated Mar. 4, 2013. Translation provided by Unitalen Attorneys at Law.
Office Action regarding Chinese Patent Application No. 200880111072.6, dated Mar. 15, 2013. Translation provided by Unitalen Attorneys at Law.
Office Action regarding U.S. Appl. No. 12/244,387, dated Mar. 21, 2013.
Office Action regarding Chinese Patent Application No. 200880110616.7, dated Apr. 1, 2013. Translation provided by Unitalen Attorneys at Law.
Office Action regarding Korean Patent Application No. 10-2010-7006707, dated Apr. 2, 2013. Translation provided by Y.S. Chang & Associates.
Office Action regarding Korean Patent Application No. 10-2010-7007052, dated Apr. 2, 2013. Translation provided by Y.S. Chang & Associates.
Office Action regarding Chinese Patent Application No. 200880110590.6, dated Apr. 15, 2013. Translation provided by Unitalen Attorneys at Law.
Office Action regarding Chinese Patent Application No. 200880110785.0, dated Apr. 28, 2013. Translation provided by Unitalen Attorneys at Law.
Notice of Allowance regarding U.S. Appl. No. 12/247,033, dated May 22, 2013.
Office Action regarding Australian Patent Application No. 2012203057, dated May 31, 2013.
Office Action regarding Chinese Patent Application No. 200880110266.4, dated Jul. 1, 2013. Translation provided by Unitalen Attorneys at Law.
Search Report regarding European Patent Application No. 13161753.2, dated Jul. 12, 2013.
Office Action regarding Chinese Patent Application No. 200880110616.7, dated Jul. 22, 2013. Translation provided by Unitalen Attorneys at Law.
Office Action regarding Chinese Patent Application No. 200880111072.6, dated Sep. 12, 2013. Translation provided by Unitalen Attorneys at Law.
Notice of Allowance regarding U.S. Appl. No. 12/244,387, dated Oct. 15, 2013.
Office Action regarding Chinese Patent Application No. 200880110785.0, dated Oct. 21, 2013. Translation provided by Unitalen Attorneys at Law.
Office Action regarding Chinese Patent Application No. 200880110616.7, dated Nov. 27, 2013. Translation provided by Unitalen Attorneys at Law.
Office Action regarding U.S. Appl. No. 14/031,905, dated Dec. 13, 2013.
Office Action regarding Chinese Patent Application No. 201110371859.X, dated Dec. 27, 2013. Translation provided by Unitalen Attorneys at Law.
Notice of Allowance regarding U.S. Appl. No. 12/983,615, dated Feb. 28, 2014.
Search Report regarding European Patent Application No. 08836902.0, dated Apr. 4, 2014.
Notice of Allowance regarding U.S. Appl. No. 12/983,615, dated May 23, 2014.
Office Action regarding Chinese Patent Application No. 201110371859.X, dated Jun. 23, 2014. Translation provided by Unitalen Attorneys at Law.
Office Action regarding U.S. Appl. No. 14/031,905, dated Jul. 23, 2014.
Advisory Action regarding U.S. Appl. No. 14/031,905, dated Oct. 2, 2014.
Search Report regarding European Patent Application No. 08837095.2, dated Nov. 25, 2014.
Office Action regarding Chinese Patent Application No. 201310109930.6, dated Dec. 3, 2014. Translation provided by Unitalen Attorneys At Law.
Office Action regarding Indian Patent Application No. 539/MUMNP/2010, dated Dec. 3, 2014.
Search Report regarding European Patent Application No. 08837504.3, dated Dec. 3, 2014.
Search Report regarding European Patent Application No. 08837777.5, dated Dec. 3, 2014.
Search Report regarding European Patent Application No. 08836944.2, dated Dec. 4, 2014.
Search Report regarding European Patent Application No. 08837249.5, dated Dec. 4, 2014.
Search Report regarding European Patent Application No. 08838154.6, dated Dec. 4, 2014.
Office Action regarding U.S. Appl. No. 14/480,350, dated Feb. 9, 2015.
Notice of Allowance regarding U.S. Appl. No. 14/480,350, dated Mar. 2, 2015.
Notice of Allowance regarding U.S. Appl. No. 14/031,905, dated Mar. 23, 2015.
Office Action regarding U.S. Appl. No. 13/845,784, dated May 11, 2015.
Office Action regarding Chinese Patent Application No. 201310484685.7, dated May 20, 2015. Translation provided by Unitalen Attorneys at Law.
Search Report regarding European Patent Application No. 08835849.4, dated Jun. 9, 2015.
Search Report regarding European Patent Application No. 08836567.1, dated Jun. 9, 2015.
Interview Summary regarding U.S. Appl. No. 13/845,784, dated Jul. 6, 2015.
Search Report regarding European Patent Application No. 08837748.6, dated Aug. 7, 2015.
Office Action regarding Chinese Patent Application No. 201310109930.6, dated Aug. 25, 2015. Translation provided by Unitalen Attorneys at Law.
Office Action regarding Indian Patent Application No. 539/MUMNP/2010, dated Aug. 27, 2015.
Notice of Allowance regarding U.S. Appl. No. 13/845,784, dated Oct. 9, 2015.
Restriction Requirement regarding U.S. Appl. No. 13/828,246, dated Oct. 15, 2015.
Restriction Requirement regarding U.S. Appl. No. 13/893,493, dated Oct. 29, 2015.
Office Action regarding Chinese Patent Application No. 201410312784.1, dated Nov. 30, 2015. Translation provided by Unitalen Attorneys at Law.
Office Action regarding Indian Patent Application No. 536/MUMNP/2010, dated Dec. 31, 2015.

(56) References Cited

OTHER PUBLICATIONS

Office Action regarding U.S. Appl. No. 14/739,207, dated Dec. 31, 2015.
Office Action regarding Indian Patent Application No. 538/MUMNP/2010, dated Jan. 29, 2016.
Office Action regarding U.S. Appl. No. 13/828,246, dated Feb. 19, 2016.
Restriction Requirement regarding U.S. Appl. No. 13/893,493, dated Mar. 29, 2016.
Office Action regarding U.S. Appl. No. 14/739,207, dated May 20, 2016.
Patent Board Decision on Appeal regarding U.S. Appl. No. 12/246,893, dated Jul. 1, 2016.
Office Action regarding U.S. Appl. No. 13/893,493, dated Jul. 14, 2016.
Advisory Action regarding U.S. Appl. No. 14/739,207, dated Aug. 2, 2016.
Office Action regarding Chinese Patent Application No. 201410312784.1, dated Aug. 3, 2016. Translation provided by Unitalen Attorneys At Law.
Office Action regarding European Patent Application No. 08835849.4, dated Aug. 5, 2016.
Office Action regarding U.S. Appl. No. 13/828,246, dated Aug. 12, 2016.
Patent Board Decision regarding U.S. Appl. No. 12/247,001, dated Aug. 24, 2016.
Notice of Allowance regarding U.S. Appl. No. 14/739,207, dated Aug. 31, 2016.
Notice of Allowance regarding U.S. Appl. No. 12/247,001, dated Sep. 26, 2016.
Notice of Allowance regarding U.S. Appl. No. 13/893,493, dated Sep. 26, 2016.
Advisory Action regarding U.S. Appl. No. 13/828,246, dated Nov. 16, 2016.
Office Action regarding European Patent Application No. 08836902.0, dated Dec. 2, 2016.
Office Action regarding Chinese Patent Application No. 201510382548.1, dated Dec. 9, 2016. Translation provided by Unitalen Attorneys at Law.
Office Action regarding U.S. Appl. No. 12/246,893, dated Dec. 28, 2016.
Notice of Allowance regarding U.S. Appl. No. 14/499,849, dated Mar. 2, 2017.
Interview Summary regarding U.S. Appl. No. 12/246,893, dated Mar. 15, 2017.
Office Action regarding U.S. Appl. No. 12/246,893, dated Apr. 14, 2017.
Notice of Allowance regarding U.S. Appl. No. 14/499,849, dated Apr. 18, 2017.
Office Action regarding European Patent Application No. 08837777.5, dated Jun. 14, 2017.
Office Action regarding European Patent Application No. 08836944.2, dated Jul. 5, 2017.
Office Action regarding European Patent Application No. 08837095.2, dated Jul. 5, 2017.
Office Action regarding European Patent Application No. 08837504.3, dated Jul. 5, 2017.
Office Action regarding Chinese Patent Application No. 201510389135.6, dated Jul. 21, 2017. Translation provided by Unitalen Attorneys at Law.
Office Action regarding U.S. Appl. No. 12/246,893, dated Aug. 23, 2017.
Restriction Requirement regarding U.S. Appl. No. 15/346,220, dated Nov. 14, 2017.
Office Action regarding European Patent Application No. 08837095.2, dated Dec. 13, 2017.
Office Action regarding European Patent Application No. 08837504.3, dated Jan. 19, 2018.
Office Action regarding European Patent Application No. 08836944.2, dated Jan. 26, 2018.
Office Action regarding U.S. Appl. No. 15/346,220, dated Feb. 22, 2018.
Office Action regarding European Patent Application No. 08836944.2, dated Jun. 12, 2018.
Office Action regarding European Patent Application No. 08836902.0, dated Jun. 25, 2018.
Notice of Allowance regarding U.S. Appl. No. 15/346,220, dated Jul. 11, 2018.
Office Action regarding European Patent Appllication No. 08836944.2, dated Nov. 20, 2018.
Office Action regarding European Patent Application No. 08837095.2, dated Nov. 20, 2018.
Office Action regarding European Patent Application No. 08837504.3, dated Nov. 20, 2018.
Office Action regarding European Patent Application No. 08836902.0, dated Nov. 23, 2018.
Office Action regarding European Patent Application No. 08836902.0, dated Mar. 25, 2019.
Office Action regarding European Patent Application No. 08836944.2, dated Apr. 5, 2019.
Office Action regarding European Patent Application No. 08837504.3, dated Sep. 16, 2019.
Office Action regarding U.S. Appl. No. 16/131,585, dated May 13, 2020.
Notice of Allowance regarding U.S. Appl. No. 14/031,905, dated Apr. 27, 2015.
Notice of Appeal from the Examiner to the Board of Patent Appeals and Interferences and Pre-Appeal Brief Request for Review regarding U.S. Appl. No. 12/247,001, dated Dec. 1, 2011.
Notice of Panel Decision from Pre-Appeal Brief Review regarding U.S. Appl. No. 12/247,001, dated Dec. 27, 2011.
Appeal Brief regarding U.S. Appl. No. 12/247,001, dated Feb. 1, 2012.
Response to Rule 312 Communication regarding U.S. Appl. No. 12/244,528, dated Dec. 7, 2010.
Notice of Allowance regarding U.S. Appl. No. 16/131,585 dated Sep. 29, 2020.
International Search Report regarding Application No. PCT/US2020/043511 dated Nov. 3, 2020.
Written Opinion of the ISA regarding Application No. PCT/US2020/043511 dated Nov. 3, 2020.
Notice of Allowance regarding U.S. Appl. No. 16/935,786 dated Aug. 12, 2021.
Office Action dated Feb. 17, 2023, regarding Chinese Application No. 202080061590.2.

\* cited by examiner

ELECTRONICS ENCLOSURE WITH HEAT-TRANSFER ELEMENT

CROSS-REFERENCE TO RELATED APPLICATIONS

This application is a continuation of U.S. application Ser. No. 16/935,786 filed on Jul. 22, 2020, which claims the benefit of U.S. Provisional Application No. 62/878,497 filed on Jul. 25, 2019. The entire disclosures of the above applications are incorporated herein by reference.

FIELD

The present disclosure relates to an electronics enclosure with a heat-transfer element.

BACKGROUND

This section provides background information related to the present disclosure and is not necessarily prior art.

Electronic components, such as control modules for a compressor, for example, generate heat during operation. Such electronic components are often housed in sealed enclosures that protect the electronic components from exposure to moisture, dirt, and debris. A fan can be provided within the enclosure to facilitate heat transfer between the electronic components and air within the enclosure. Heat can then be transferred from the air to the walls of the enclosure, and subsequently to the ambient atmosphere, for example. The present disclosure provides an enclosure for electronic components and includes features for improving airflow within the enclosure to improve cooling of the electronic components.

SUMMARY

This section provides a general summary of the disclosure, and is not a comprehensive disclosure of its full scope or all of its features.

In one form, the present disclosure provides a compressor that may include a compressor shell, a compression mechanism disposed within the compressor shell, a motor disposed within the shell and driving the compression mechanism, and a control module in communication with the motor and configured to control operation of the motor. An enclosure may be mounted to the compressor shell and may define an internal cavity in which the control module may be disposed. A fan may be disposed within the internal cavity. The enclosure may include an airflow deflector having a base portion, a first leg, and a second leg. The first and second legs may be spaced apart from each other and extend from the base portion. The fan may force air against the base portion. A first portion of the air may flow from the base portion along the first leg. A second portion of the air may flow from the base portion along the second leg.

In some configurations of the compressor of the above paragraph, the airflow deflector is integrally formed with a shell member that defines the enclosure. In some configurations, the airflow deflector is a recess formed in the shell member.

In some configurations of the compressor, the airflow deflector is formed separately from a shell member that defines the enclosure. In some configurations, the airflow deflector is mounted to the shell member.

In some configurations of the compressor of any of the above paragraphs, the base portion and the first and second legs cooperate to form a U-shape.

In some configurations of the compressor of any of the above paragraphs, the fan is aligned with the base portion such that a rotational axis of the fan extends through the base portion.

In some configurations of the compressor of any of the above paragraphs, the first and second legs include curved surfaces.

In some configurations of the compressor of any of the above paragraphs, air flows from the fan toward the base portion in a first direction.

In some configurations of the compressor of any of the above paragraphs, the curved surfaces of the first and second legs curve in a second direction as the curved surfaces extend away from the base portion.

In some configurations of the compressor of any of the above paragraphs, the second direction is opposite the first direction.

In another form, the present disclosure provides an assembly that may include a shell, an electronic component, a fan, and an airflow deflector. The shell member may at least partially define an enclosure having an internal cavity. The electronic component may be disposed within the internal cavity. The fan may be disposed within the internal cavity. The airflow deflector may include a base portion, a first leg, and a second leg. The first and second legs may be spaced apart from each other and extend from the base portion. The fan may force air against the base portion. A first portion of the air may flow from the base portion along the first leg. A second portion of the air may flow from the base portion along the second leg.

In some configurations of the assembly of the above paragraph, the airflow deflector is integrally formed with the shell member.

In some configurations of the assembly of either of the above paragraphs, the airflow deflector is a recess formed in the shell member.

In some configurations, the airflow deflector is formed separately from the shell member and is mounted to the shell member.

In some configurations of the assembly of any of the above paragraphs, the base portion and the first and second legs cooperate to form a U-shape.

In some configurations of the assembly of any of the above paragraphs, the fan is aligned with the base portion such that a rotational axis of the fan extends through the base portion.

In some configurations of the assembly of any of the above paragraphs, the first and second legs include curved surfaces.

In some configurations of the assembly of any of the above paragraphs, air flows from the fan toward the base portion in a first direction.

In some configurations of the assembly of any of the above paragraphs, the curved surfaces of the first and second legs may curve in a second direction as the curved surfaces extend away from the base portion.

In some configurations of the assembly of any of the above paragraphs, the second direction is opposite the first direction.

In some configurations of the assembly of any of the above paragraphs, the electronic component is disposed adjacent the base portion and between the first and second legs.

In some configurations of the assembly of any of the above paragraphs, the electronic component is, includes or is a part of a control module configured to control operation of a compressor.

In some configurations of the assembly of any of the above paragraphs, the enclosure is mounted to a shell of the compressor.

In some configurations of the assembly of any of the above paragraphs, a depth of the airflow deflector and an angle of attack of the first and second legs are configured to optimize airflow within the enclosure.

In some configurations of the assembly of any of the above paragraphs, the cavity is sealed such that air does not flow into or out of the cavity.

In some configurations of the assembly of any of the above paragraphs, the shell member may include heat sink fins. The fins may be formed on an exterior surface of the shell member.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Figure 1:
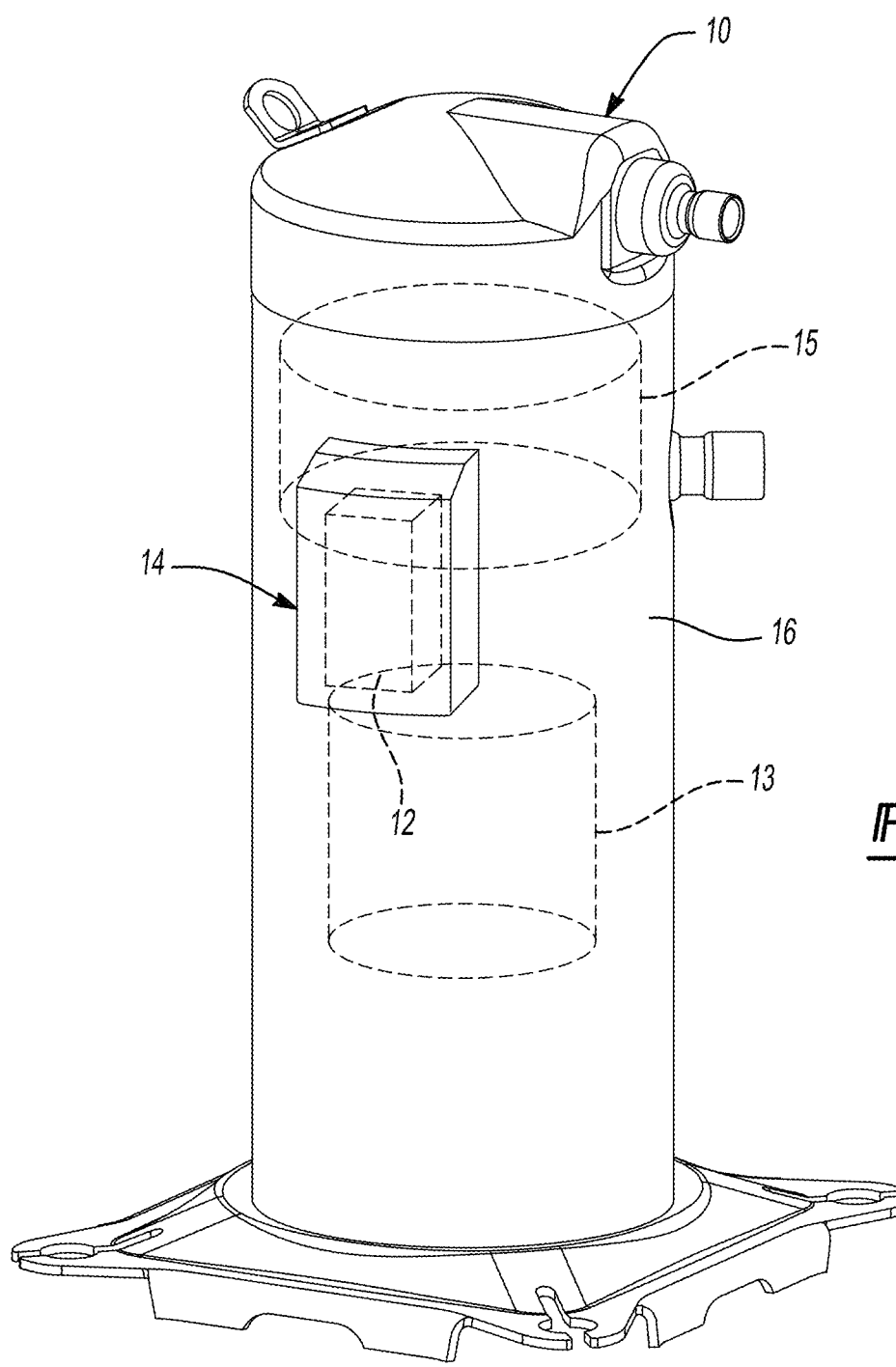
FIG. 1 is a perspective view of a compressor including a control module and an enclosure in which the control module is housed.
Figure 2:
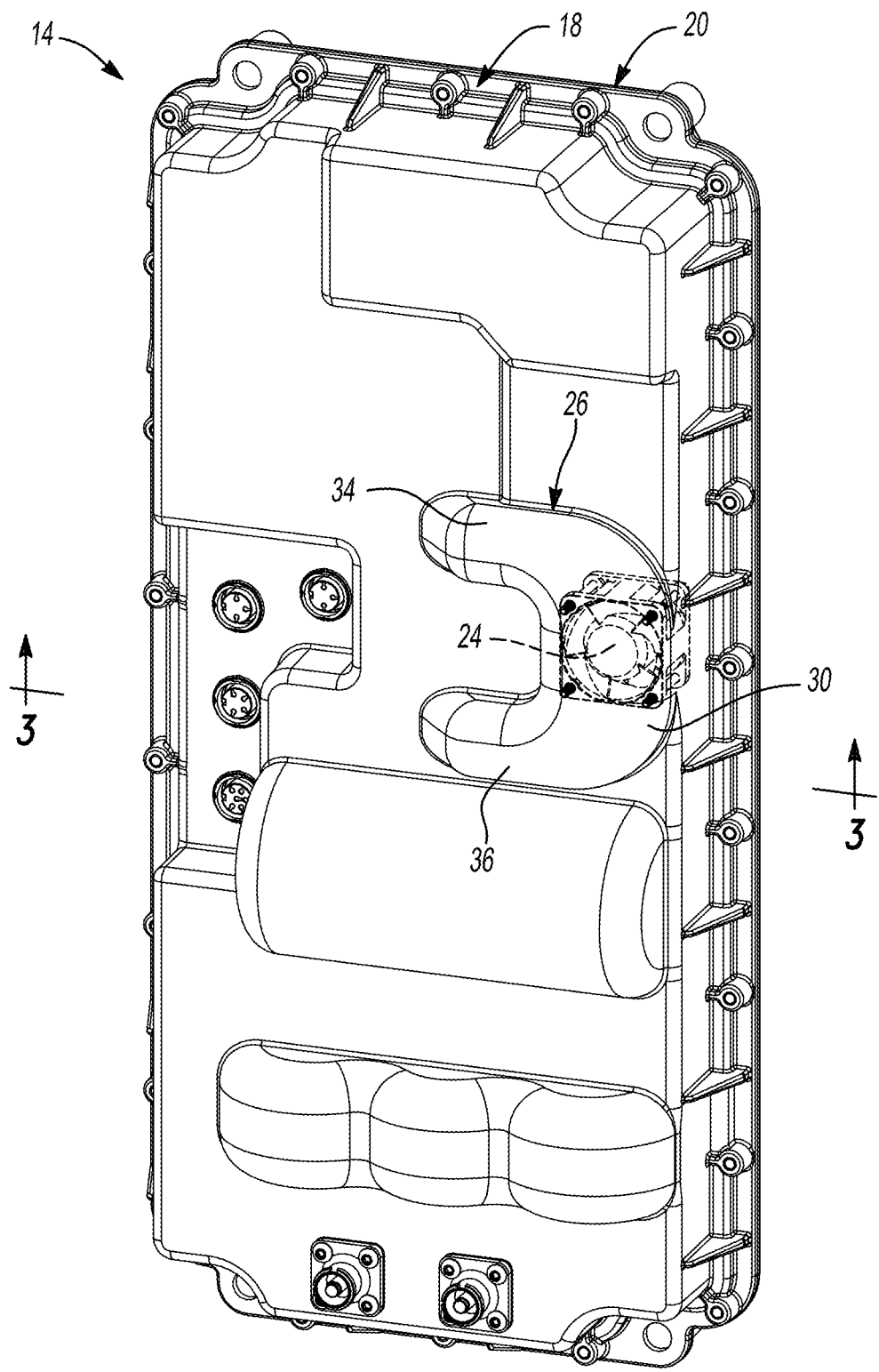
FIG. 2 is a perspective view of the enclosure.

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

With reference to FIG. 1, a compressor 10 is provided that may be operable to compress a working fluid (e.g., a refrigerant) and circulate the working fluid throughout a vapor compression circuit of a climate-control system (e.g., a refrigeration or air conditioning system). The compressor 10 includes a control module 12 disposed within an enclosure 14. The control module 12 may include processing circuitry (e.g., a circuit board) and other electronic components and may be operable to control operation of the compressor 10 and/or diagnose compressor faults. For example, the control module 12 may be a variable-speed drive for controlling a motor 13 of a variable-speed compressor. The motor 13 may drive a compression mechanism 15 of the compressor 10 (e.g., via a driveshaft). For example, the compression mechanism 15 may be a scroll compression mechanism (including a pair of interleaving scrolls), a reciprocating compression mechanism (including one or more pistons and cylinders), a rotary vane compression mechanism (including a rotor and cylinder), or any other type of compression mechanism. The enclosure 14 may house the control module 12 and can be mounted to a shell 16 of the compressor 10.

Referring now to FIGS. 2-5, the enclosure 14 will be described in detail. The enclosure 14 may include a first shell member 18 (FIGS. 2-5) and a second shell member 20 (FIG. 3) that cooperate to define a sealed internal cavity 22 (FIG. 3) in which the control module 12 is disposed. The first and second shell members 18, 20 can be fixed to each other by bolts or other fasteners, for example.

A fan 24 may be disposed within the cavity 22 and is operable to circulate air around the cavity 22 to convectively cool the control module 12. The fan 24 may be attached to or mounted proximate an airflow deflector (or airfoil) 26. In the particular example shown in FIGS. 2-5, the airflow deflector 26 is integrally formed in the first shell member 18. In some configurations, heat sink fins may be formed on exterior surfaces of the first shell member 18 and/or the second shell member 20.

Figure 4:
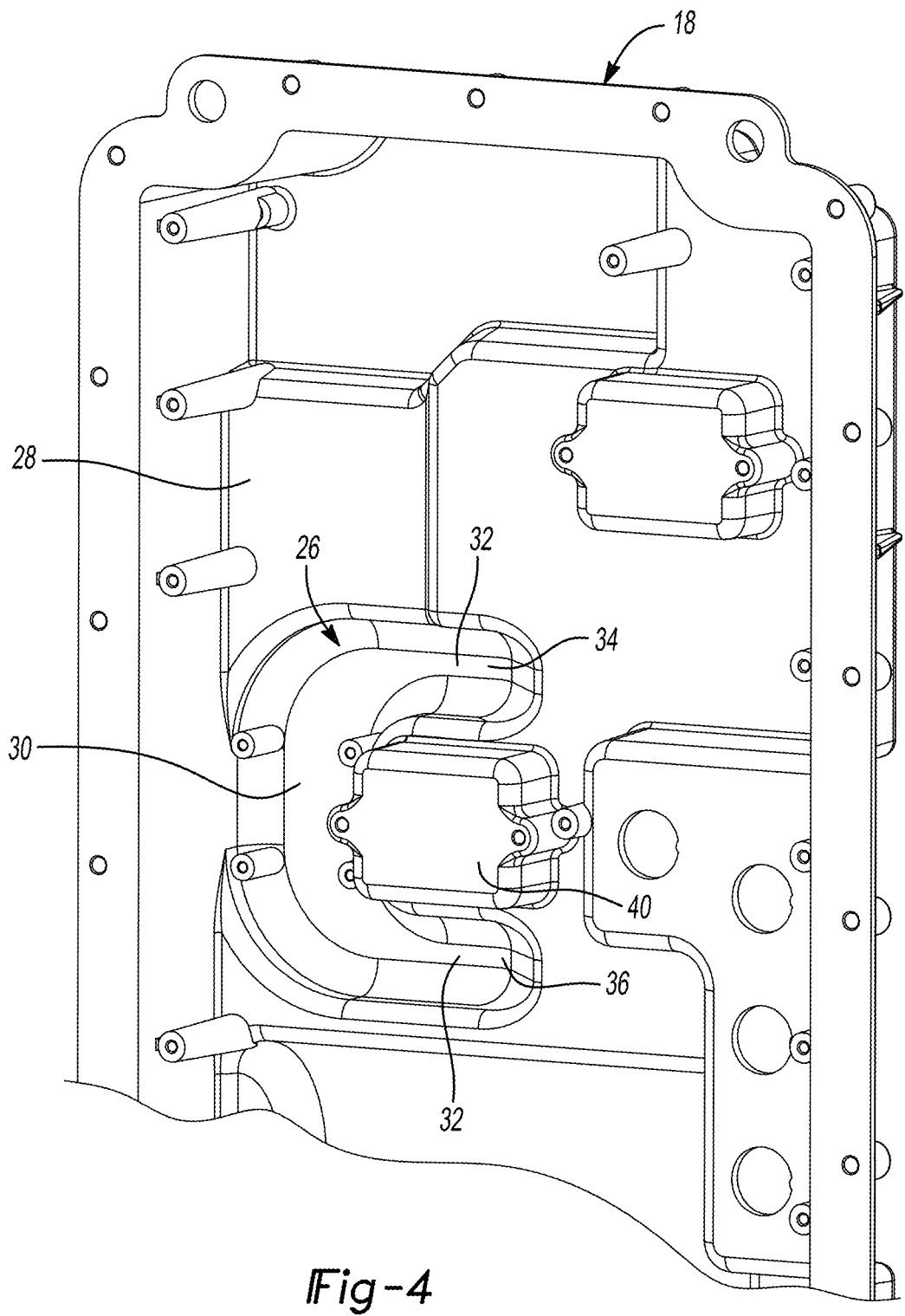
FIG. 4 is a partial perspective view of an interior of a shell member of the enclosure.

As shown in FIG. 4, the airflow deflector 26 may be a generally U-shaped scoop or recess formed in an interior surface 28 of the first shell member 18. The airflow deflector 26 may include a base portion 30, a first leg 34, and a second leg 36. The first and second legs 34, 36 may be spaced apart from each other and may extend from the base portion 30. The first and second legs 34, 36 may define first and second airflow paths, respectively. That is, the fan 24 may force air against the base portion 30 between the first and second legs 34, 36, and a first portion of that air may flow through the first airflow path along the first leg 34 and a second portion of the air may flow through the second airflow path along the second leg 36. From the first and second legs 34, 36, the air may flow throughout the internal cavity 22 of the enclosure 14 to cool the control module 12.

Figure 3:
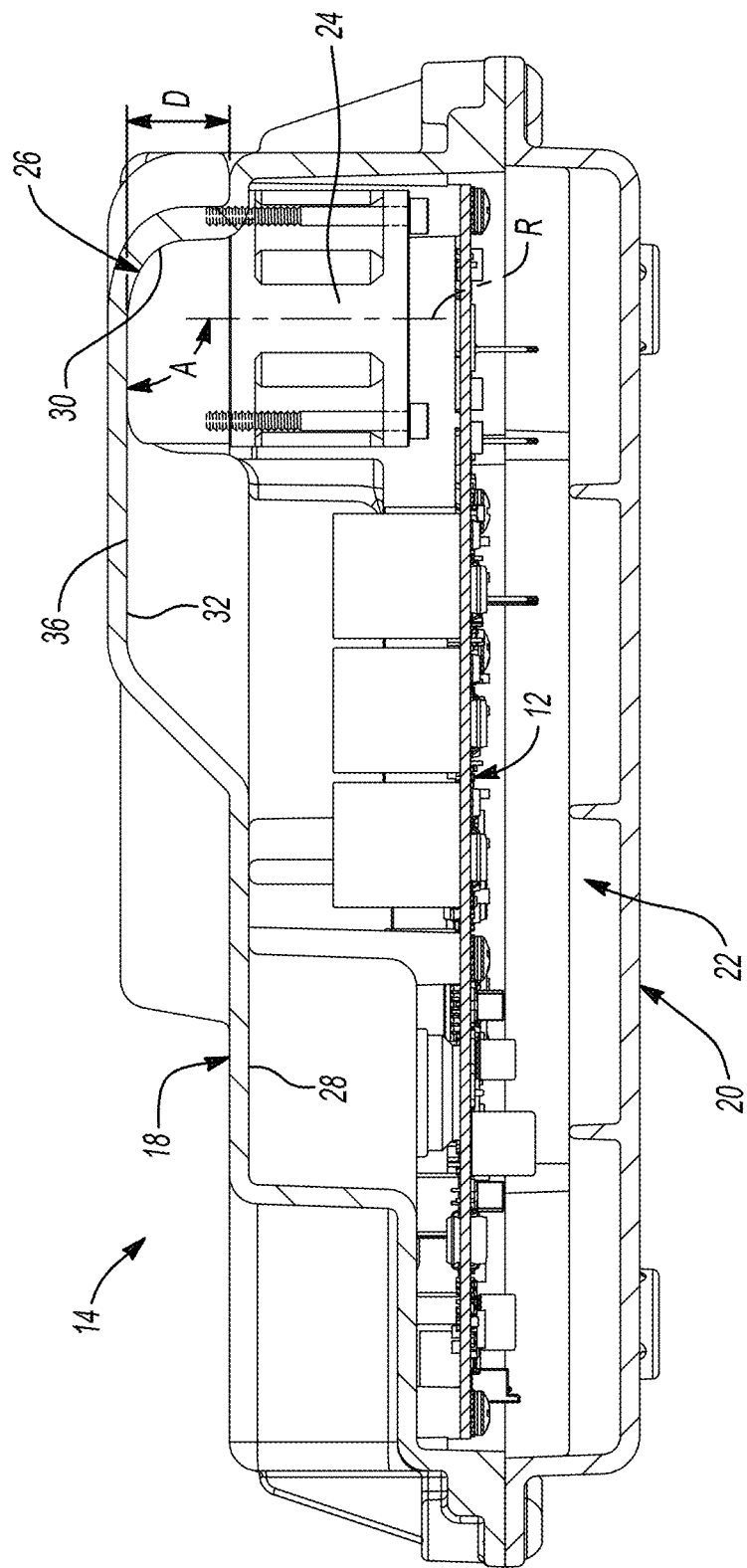
FIG. 3 is a cross-sectional view of the enclosure and control module taken along line 3-3 of FIG. 2.

As shown in FIG. 3, the base portion 30 of the airflow deflector 26 may have a depth D. The depth D may be a distance (measured along or parallel to a rotational axis R of the fan 24) between the fan 24 and a base portion 30 of the airflow deflector 26. A base surface 32 of each of the first and second legs 34, 36 may be disposed at an angle of attack A (e.g., an angle between the base surface 32 and the rotational axis R). The base surfaces 32 of the first and second legs 34, 36 can be curved or sloped. The depth D, angle of attack A, and any curve of slope of the base surfaces 32 may be selected to maximize airflow velocity through the airflow deflector 26 and minimize a pressure drop of air flowing through the airflow deflector 26.

Figure 5:
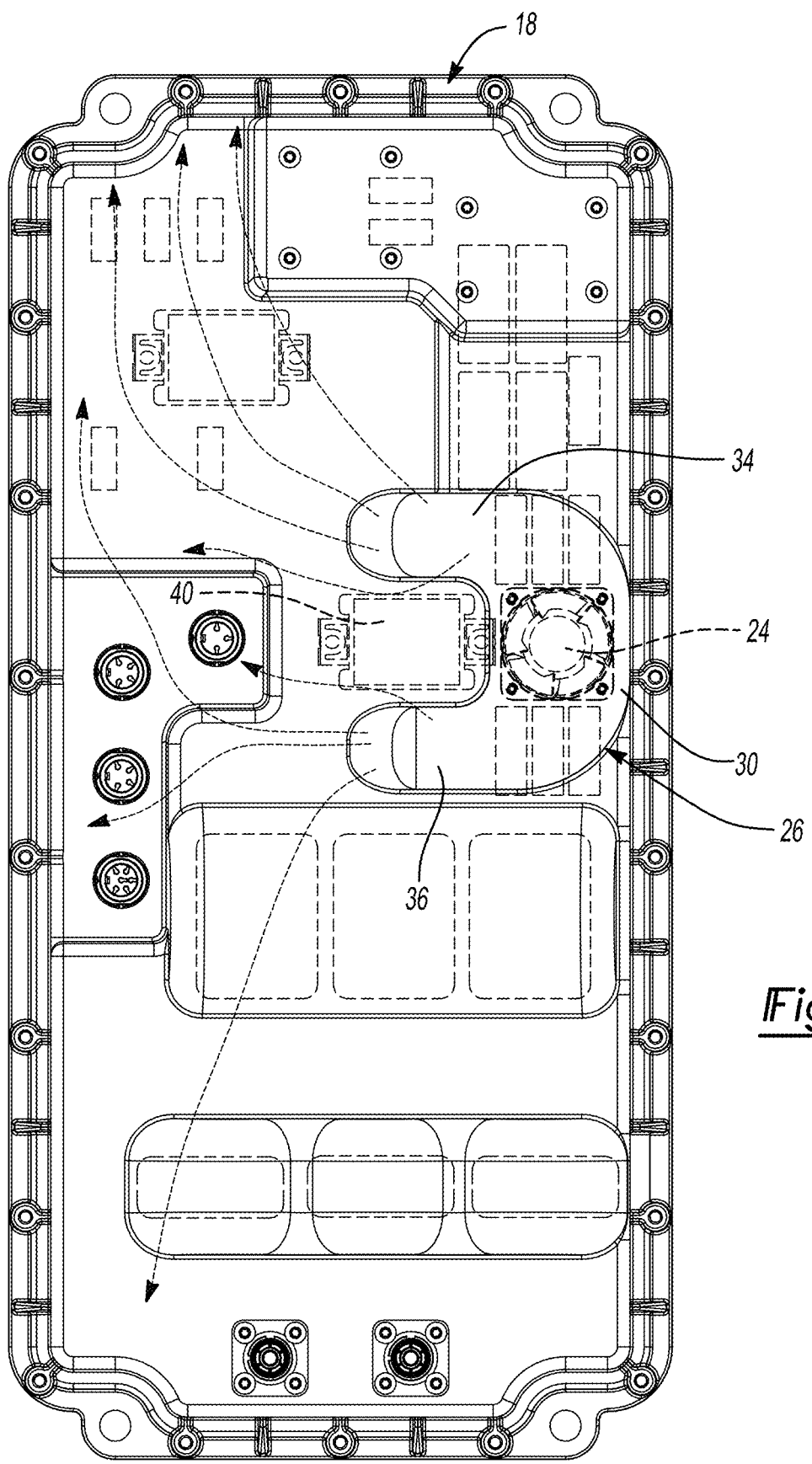
FIG. 5 is a plan view of an exterior of the shell member.
Figure 6:
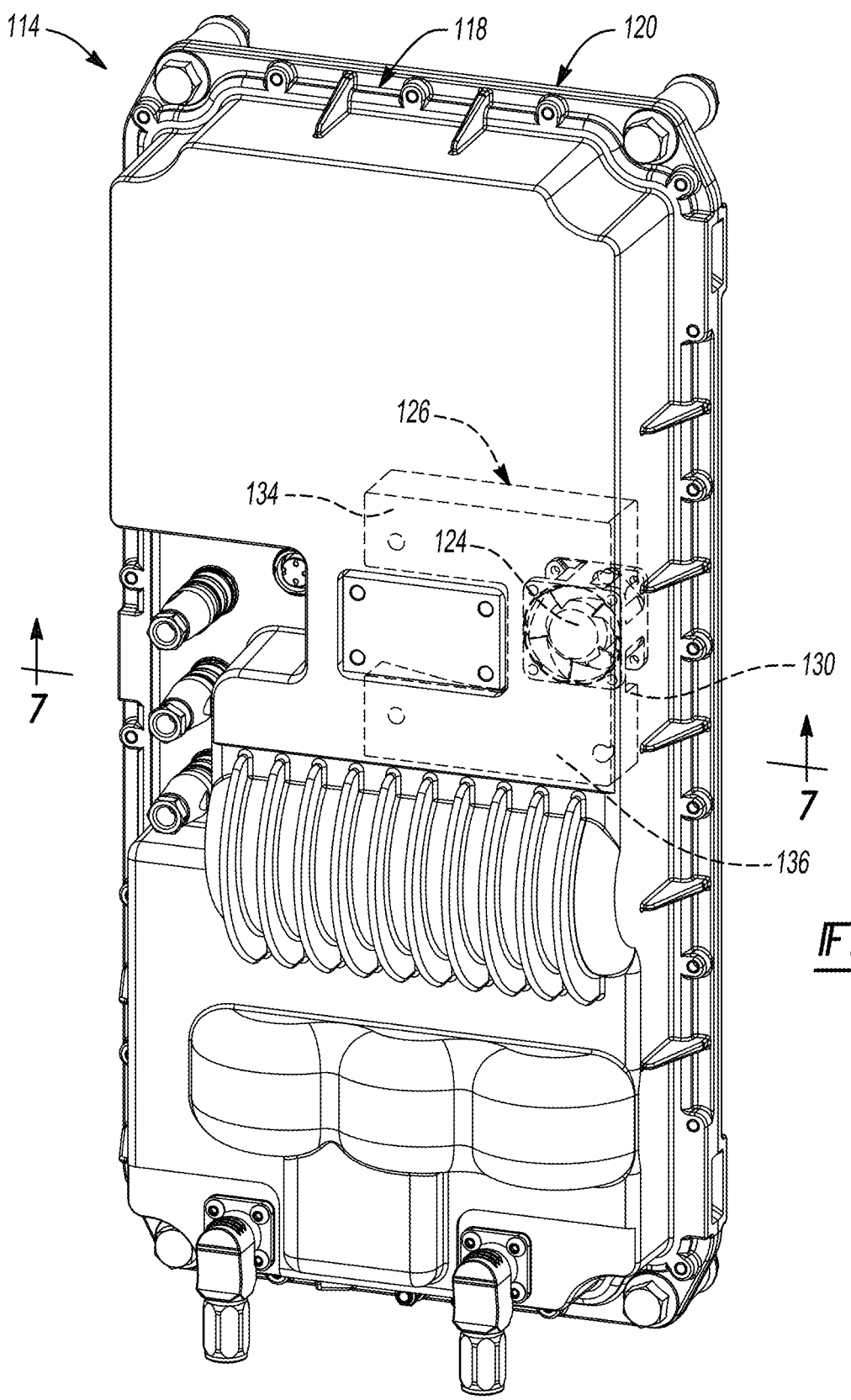
FIG. 6 is a perspective view of an alternative enclosure for housing the control module.

As shown in FIG. 5, one or more electronic components 40 of the control module 12 may be positioned between the first and second legs 34, 36 and adjacent the base portion 30. Such positioning may enhance the cooling of the components 40. For this reason, in some configurations, the component(s) 40 selected to be positioned between first and second legs 34, 36 may be components that tend to generate the most heat and/or need the most cooling.

Referring now to FIGS. 6-10, an alternative enclosure 114 is provided that can house the control module 12. The enclosure 114 may include a first shell member 118, a second shell member 120, and a fan 124. The first and second shell members 118, 120 and fan 124 be similar or identical to the shell members 18, 20 and fan 24 described above, except that the first shell member 118 does not include an integrally formed airflow deflector. Instead, the enclosure 114 includes a separate airflow deflector (or airfoil) 126 that may be mounted to the first shell member 118.

Figure 7:
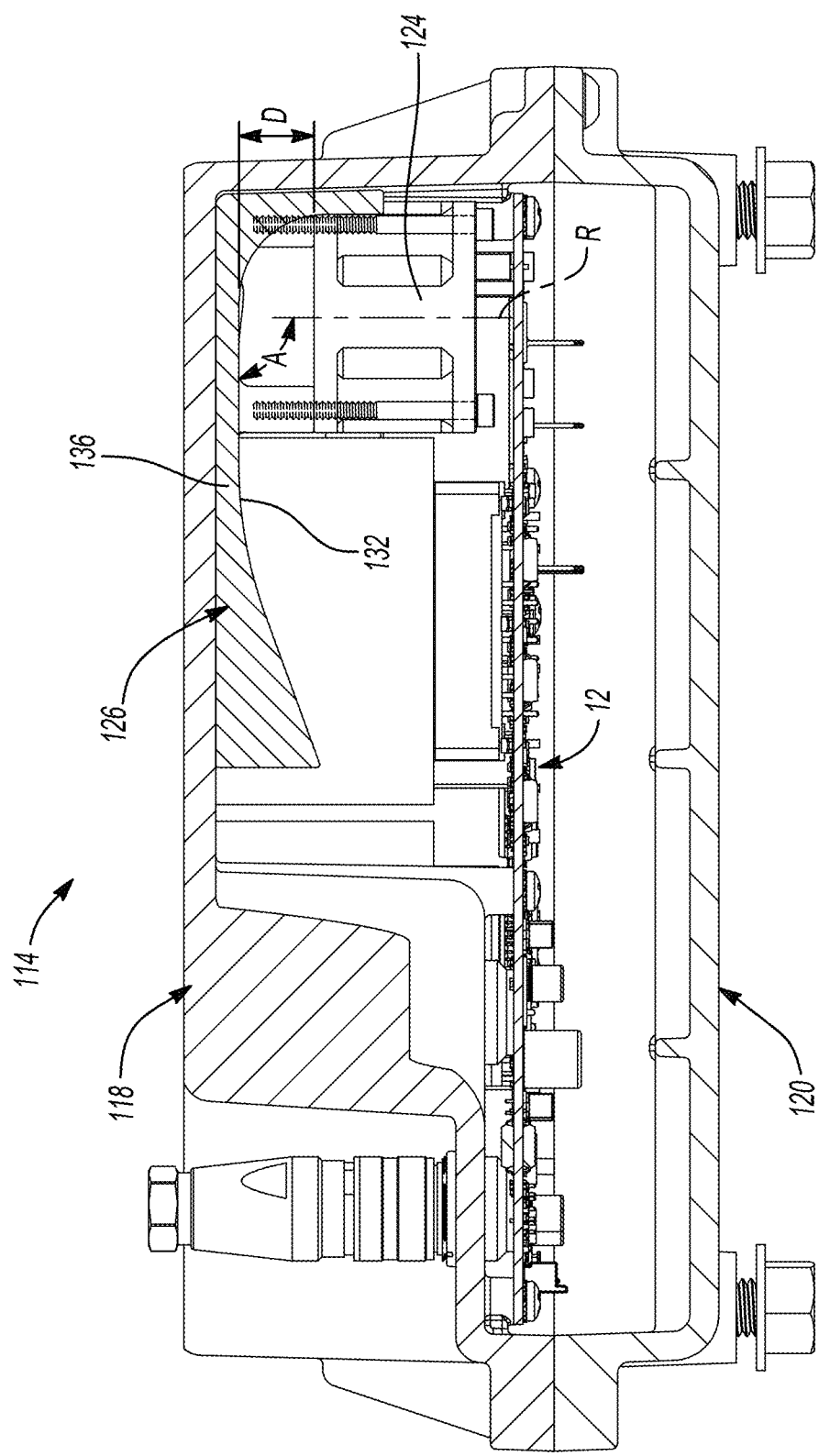
FIG. 7 is a cross-sectional view of the enclosure and control module taken along line 7-7 of FIG. 6.
Figure 8:
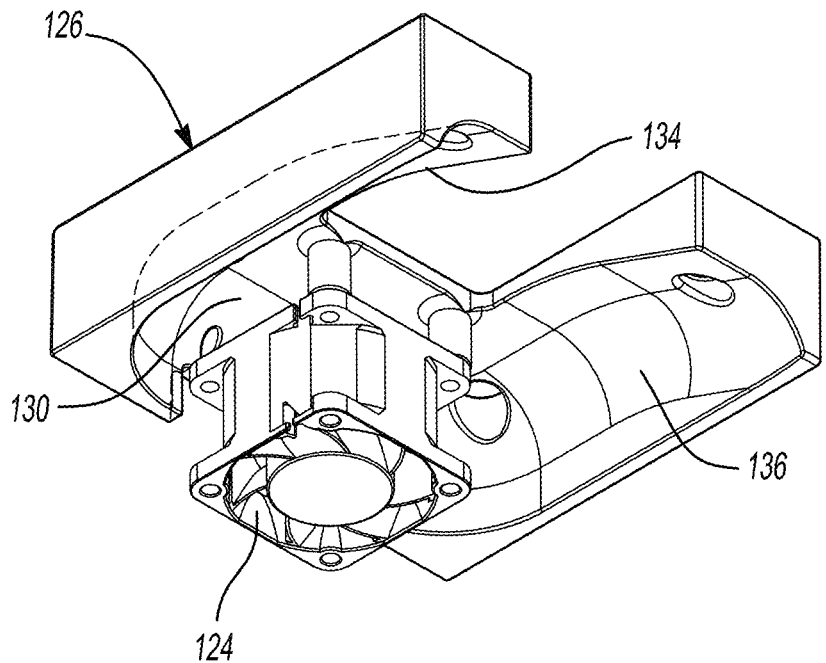
FIG. 8 is a perspective view of an airflow deflector and fan of the enclosure of FIG. 6.
Figure 9:
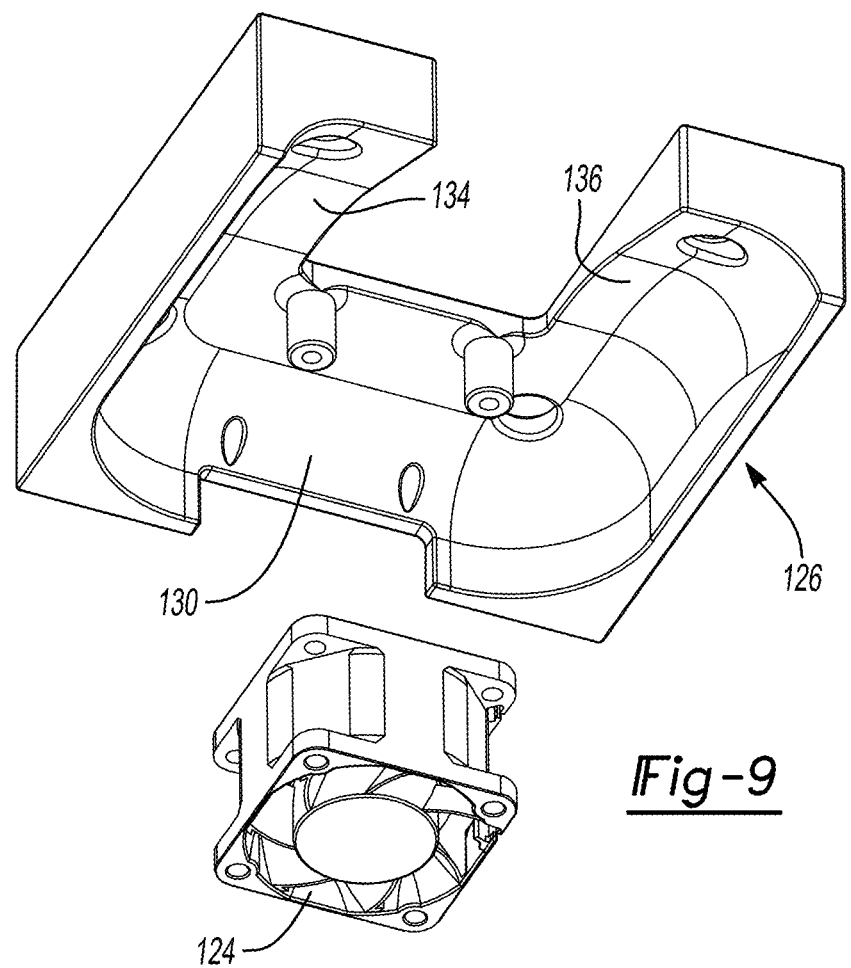
FIG. 9 is an exploded perspective view of the airflow deflector and fan.
Figure 10:
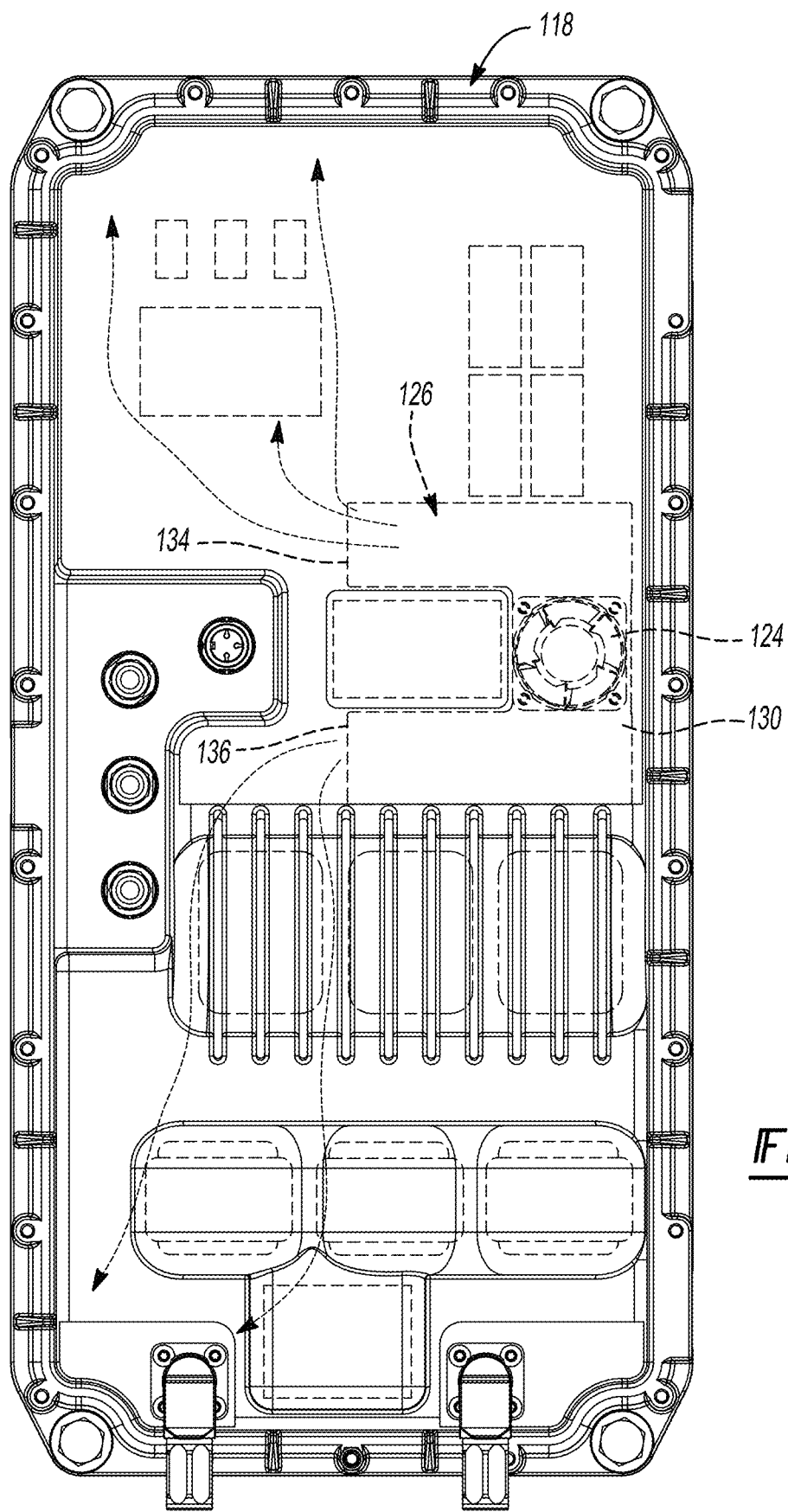
FIG. 10 is a plan view of the enclosure of FIG. 6.

Like the airflow deflector 26, the airflow deflector 126 may be generally U-shaped and may include a base portion 130, a first leg 134, and a second leg 136. As shown in FIG. 7, the base portion 130 of the airflow deflector 126 may have a depth D. The depth D may be a distance (measured along or parallel to a rotational axis R of the fan 124) between the fan 124 and a base portion 130 of the airflow deflector 126. A base surface 132 of each of the first and second legs 134, 136 may be disposed at an angle of attack A (e.g., an angle between the base surface 132 and the rotational axis R). The base surfaces 132 of the first and second legs 134, 136 can be curved or sloped. The depth D, angle of attack A, and any curve of slope of the base surfaces 132 may be selected to maximize airflow velocity through the airflow deflector 126 and minimize a pressure drop of air flowing through the airflow deflector 126.

The airflow deflectors 26, 126 of the enclosures 14, 114 may improve airflow throughout the interior of the enclosures 14, 114 and around the control module 12. Furthermore, the airflow deflectors 26, 126 may reduce or eliminate turbulence in the airflow, which improves heat transfer between the control module 12 and the air within the enclosure 14, 114.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. An assembly comprising:
    a compressor including a compressor shell, a compression mechanism disposed within the compressor shell, and a motor driving the compression mechanism;
    an enclosure physically connected to the compressor and defining an internal cavity;
    a control module in communication with the compressor and configured to control operation of the compressor;
    a fan disposed within the internal cavity; and
    an airflow deflector having a base portion, a first leg, and a second leg, wherein the first and second legs are spaced apart from each other and extend from the base portion,
    wherein the fan forces air against the base portion, wherein a first portion of the air flows from the base portion along the first leg, and wherein a second portion of the air flows from the base portion along the second leg.

2. The assembly of claim 1, wherein the airflow deflector is integrally formed with a shell member that defines the enclosure.

3. The assembly of claim 2, wherein the airflow deflector is a recess formed in the shell member.

4. The assembly of claim 1, wherein the airflow deflector is formed separately from a shell member that defines the enclosure, and wherein the airflow deflector is mounted to the shell member.

5. The assembly of claim 1, wherein the control module is disposed within the internal cavity of the enclosure.

6. The assembly of claim 1, wherein the enclosure is mounted to the compressor shell.

7. The assembly of claim 1, wherein the base portion and the first and second legs cooperate to form a U-shape, and wherein the fan is aligned with the base portion such that a rotational axis of the fan extends through the base portion.

8. The assembly of claim 1, wherein the first and second legs include curved surfaces, wherein the air flows from the fan toward the base portion in a first direction, wherein the curved surfaces of the first and second legs curve in a second direction as the curved surfaces extend away from the base portion, and wherein the second direction is opposite the first direction.

9. The assembly of claim 1, wherein the internal cavity is a sealed cavity.

10. A compressor comprising:
a compressor shell;
a compression mechanism disposed within the compressor shell,
a motor driving the compression mechanism;
an enclosure defining an internal cavity;
a control module in communication with the motor and configured to control operation of the motor;
a fan disposed within the internal cavity; and
an airflow deflector having a base portion, a first leg, and a second leg, wherein the first and second legs are spaced apart from each other and extend from the base portion,
wherein the fan forces air against the base portion, wherein a first portion of the air flows from the base portion along the first leg, and wherein a second portion of the air flows from the base portion along the second leg.

11. The compressor of claim 10, wherein the airflow deflector is integrally formed with a shell member that defines the enclosure.

12. The compressor of claim 11, wherein the airflow deflector is a recess formed in the shell member.

13. The compressor of claim 10, wherein the airflow deflector is formed separately from a shell member that defines the enclosure, and wherein the airflow deflector is mounted to the shell member.

14. The compressor of claim 10, wherein the enclosure is connected to the compressor shell.

15. The compressor of claim 14, wherein the enclosure is mounted to the compressor shell.

16. The compressor of claim 10, wherein the base portion and the first and second legs cooperate to form a U-shape, and wherein the fan is aligned with the base portion such that a rotational axis of the fan extends through the base portion.

17. The compressor of claim 10, wherein the first and second legs include curved surfaces, wherein the air flows from the fan toward the base portion in a first direction, wherein the curved surfaces of the first and second legs curve in a second direction as the curved surfaces extend away from the base portion, and wherein the second direction is opposite the first direction.

18. The compressor of claim 10, wherein a depth of the airflow deflector and an angle of attack of the first and second legs are configured to optimize airflow within the enclosure.

19. The compressor of claim 10, wherein the control module is disposed within internal cavity of the enclosure.

20. The compressor of claim 10, wherein the internal cavity is a sealed cavity.

* * * * *

UNITED STATES PATENT AND TRADEMARK OFFICE
CERTIFICATE OF CORRECTION

| | |
|---|---|
| PATENT NO. | : 11,706,899 B2 |
| APPLICATION NO. | : 17/643991 |
| DATED | : July 18, 2023 |
| INVENTOR(S) | : Nikhil R. Lakhkar et al. |

Page 1 of 1

It is certified that error appears in the above-identified patent and that said Letters Patent is hereby corrected as shown below:

On the Title Page

Item (73) Assignee:
Please change "Emerson Climate Technologies, Inc." to --Copeland LP, 1675 West Campbell Road, Sidney, OH 45365-0669--

Signed and Sealed this
Twenty-fifth Day of February, 2025

Coke Morgan Stewart
*Acting Director of the United States Patent and Trademark Office*